US012136378B2

(12) United States Patent
Liu et al.

(10) Patent No.: US 12,136,378 B2
(45) Date of Patent: Nov. 5, 2024

(54) SHIFT REGISTER UNIT AND DRIVING METHOD THEREOF, GATE DRIVE CIRCUIT AND DISPLAY DEVICE

(71) Applicant: BOE Technology Group Co., Ltd., Beijing (CN)

(72) Inventors: Weixing Liu, Beijing (CN); Jintao Peng, Beijing (CN); Jiao Li, Beijing (CN); Chunfang Zhang, Beijing (CN); Xinxing Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/022,479

(22) PCT Filed: Mar. 14, 2022

(86) PCT No.: PCT/CN2022/080769
§ 371 (c)(1),
(2) Date: Feb. 21, 2023

(87) PCT Pub. No.: WO2023/173259
PCT Pub. Date: Sep. 21, 2023

(65) Prior Publication Data
US 2024/0265843 A1 Aug. 8, 2024

(51) Int. Cl.
*G09G 3/20* (2006.01)
*G09G 3/3266* (2016.01)
*G11C 19/28* (2006.01)

(52) U.S. Cl.
CPC ......... *G09G 3/2092* (2013.01); *G09G 3/3266* (2013.01); *G09G 2310/0232* (2013.01); *G09G 2310/0267* (2013.01); *G09G 2310/0286* (2013.01); *G09G 2330/021* (2013.01); *G11C 19/28* (2013.01)

(58) Field of Classification Search
CPC ............... G09G 3/2092; G09G 3/3266; G09G 2310/0267; G09G 2310/0286; G09G 233/021; G09G 2310/027; G09G 3/3674; G09G 3/3677; G11C 19/28
See application file for complete search history.

(56) References Cited

U.S. PATENT DOCUMENTS

2013/0136224 A1* 5/2013 Qing ...................... G11C 19/28 377/64
2017/0004760 A1* 1/2017 Jang ..................... G09G 3/3677
2020/0184873 A1* 6/2020 Zheng ...................... G09G 3/20
2020/0219576 A1* 7/2020 Yao .......................... G09G 3/20
2020/0286570 A1* 9/2020 Shan .................... G09G 3/2092
2020/0357342 A1* 11/2020 Feng ...................... G11C 19/28

* cited by examiner

*Primary Examiner* — Matthew A Eason
*Assistant Examiner* — Sujit Shah
(74) *Attorney, Agent, or Firm* — IPro, PLLC

(57) ABSTRACT

Provided is a shift register unit. The shift register unit includes: a first input circuit, connected to a first control terminal, a turn-on signal terminal, a first node and a second node; a second input circuit, connected to a first power supply terminal, the first node and a third node; an output control circuit, connected to the first node, the second node, the third node, a second control terminal and a fourth node; and an output circuit, connected to the second node, the fourth node, the first power supply terminal, a second power supply terminal, a first output terminal and a second output terminal.

20 Claims, 12 Drawing Sheets

In an input phase, a potential of a turn-on signal provided by a turn-on signal terminal and a potential of a first control signal provided by a first control terminal are both a first potential, a potential of a second control signal provided by a second control terminal is a second potential, a first input circuit controls a potential at a first node and a potential at a second node to be the first potential in response to the first control signal and the turn-on signal, a second input circuit controls a potential at a third node to be the first potential in response to the potential at the first node and a first power supply signal at the first potential provided by a first power supply terminal, an output control circuit controls a potential at a fourth node to be the second potential in response to the potential at the first node, the potential at the second node, the potential at the third node and the second control signal, and an output circuit controls, in response to the potential at the second node and the potential at the fourth node, the first power supply terminal and a second power supply terminal to transmit the first power supply signal and a second power supply signal at the second potential to the first output terminal and the second output terminal respectively  1001

In an output phase, the potential of the second control signal is the first potential, the potential of the turn-on signal, the potential of the second power supply signal and the potential of the first control signal are all the second potential, the first input circuit controls the potential at the first node and the potential at the second node to be the second potential in response to the first control signal and the turn-on signal, the second input circuit controls the potential at the third node to be the first potential in response to the potential at the first node and the first power supply signal, the output control circuit controls the potential at the fourth node to be the first potential in response to the potential at the first node, the potential at the second node, the potential at the third node and the second control signal, and the output circuit controls, in response to the potential at the second node and the potential at the fourth node, the second power supply terminal and the first power supply terminal to transmit the first power supply signal and the second power supply signal to the first output terminal and the second output terminal respectively  1002

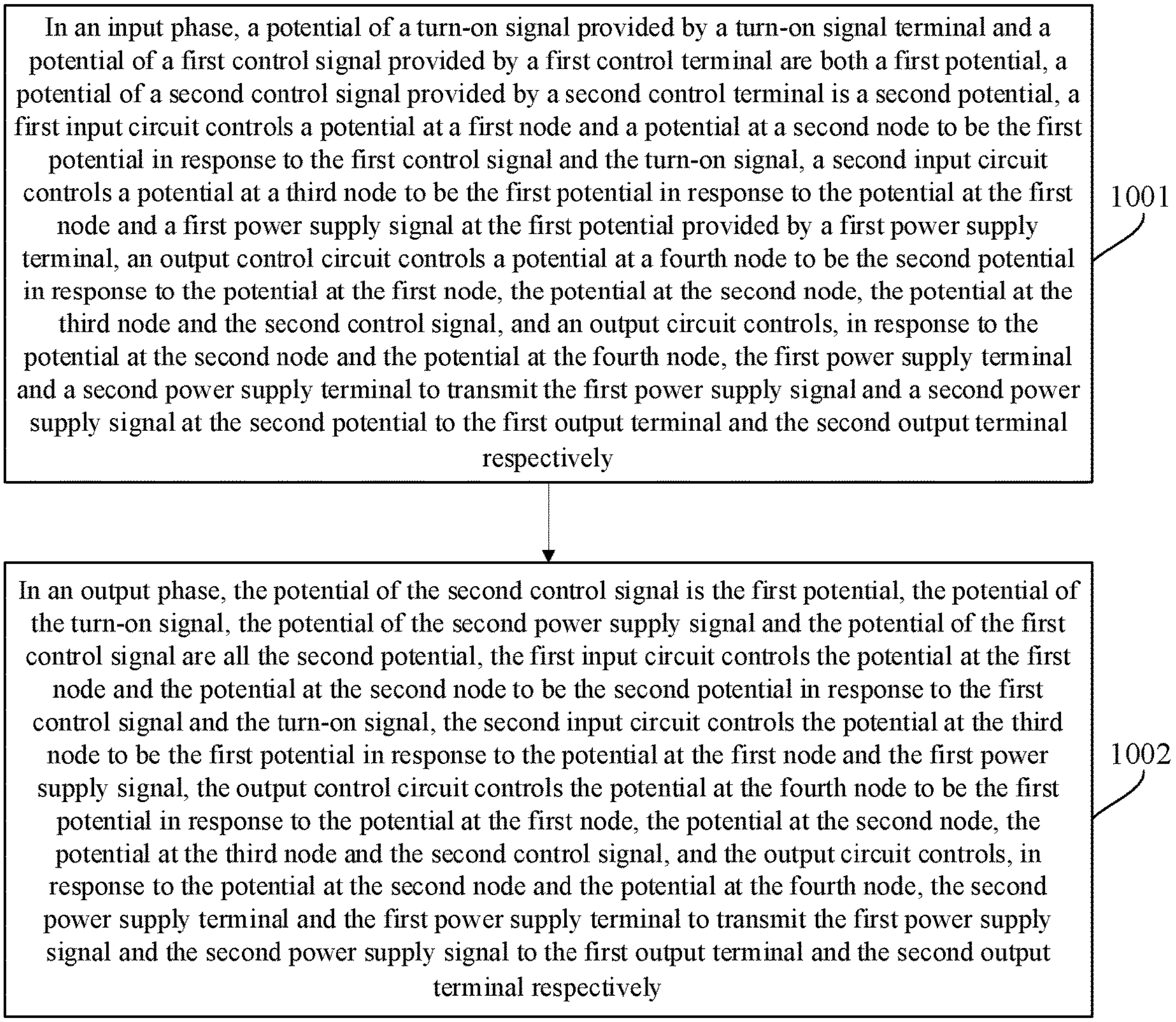

FIG. 10

SHIFT REGISTER UNIT AND DRIVING METHOD THEREOF, GATE DRIVE CIRCUIT AND DISPLAY DEVICE

CROSS-REFERENCE TO RELATED APPLICATIONS

This application is a U.S. national stage of international application No. PCT/CN2022/080769, filed on Mar. 14, 2022, the disclosure of which is incorporated herein by reference in its entirety.

TECHNICAL FIELD

The present disclosure relates to the field of display technologies, and particularly relates to a shift register unit and a driving method thereof, a gate drive circuit and a display device.

BACKGROUND OF THE INVENTION

A gate drive circuit, which is also referred to as a gate drive on array (GOA) circuit, generally includes a plurality of cascaded GOA units, and each GOA unit is configured to drive one row of pixels. The plurality of cascaded GOA units implements a progressive scan driving of various rows of pixels in the display device to display an image.

SUMMARY OF THE INVENTION

Embodiments of the present disclosure provide a shift register unit and a driving method thereof, a gate drive circuit and a display device. The technical solutions are as follows.

In some embodiments of the present disclosure, a shift register unit is provided. The shift register unit includes:

a first input circuit, connected to a first control terminal, a turn-on signal terminal, a first node and a second node, and configured to control a potential at the first node and a potential at the second node in response to a first control signal provided by the first control terminal and a turn-on signal provided by the turn-on signal terminal;

a second input circuit, connected to a first power supply terminal, the first node and a third node, and configured to control a potential at the third node in response to the potential at the first node and a first power supply signal provided by the first power supply terminal;

an output control circuit, connected to the first node, the second node, the third node, a second control terminal and a fourth node, and configured to control a potential at the fourth node in response to the potential at the first node, the potential at the second node, the potential at the third node and a second control signal provided by the second control terminal; and an output circuit, connected to the second node, the fourth node, the first power supply terminal, a second power supply terminal, a first output terminal and a second output terminal, and configured to control the first power supply terminal and the second power supply terminal to transmit the first power supply signal and a second power supply signal to the first output terminal and the second output terminal respectively at least within one same time period, in response to the potential at the second node and the potential at the fourth node.

In some embodiments, the output control circuit comprises: a delay sub-circuit and an inverter sub-circuit; wherein the delay sub-circuit is connected to the third node, the second control terminal and the fourth node, and is configured to control conduction/non-conduction between the third node and the fourth node in response to the second control signal; and the inverter sub-circuit is connected to the first node, the second node, the third node, the fourth node and a third control terminal, and is configured to control conduction/non-conduction between the third control terminal and the fourth node in response to the potential at the first node, the potential at the second node and the potential at the third node.

In some embodiments, the delay sub-circuit comprises a first transistor, a second transistor and a first capacitor; wherein a gate of the first transistor is connected to the third node, a first electrode of the first transistor is connected to the second control terminal, and a second electrode of the first transistor is connected to a first electrode of the second transistor;

a gate of the second transistor is connected to the second control terminal, and a second electrode of the second transistor is connected to the fourth node; and a first terminal of the first capacitor is connected to the third node, and a second terminal of the first capacitor is connected to the first electrode of the second transistor.

In some embodiments, the inverter sub-circuit comprises: a third transistor, a fourth transistor and a fifth transistor; wherein a gate of the third transistor is connected to the second node, a first electrode of the third transistor is connected to the third control terminal, a second electrode of the third transistor is connected to a first electrode of the fourth transistor, and the third control terminal comprises the second control terminal or the second power supply terminal; and a gate of one of the fourth transistor and the fifth transistor is connected to the third node, a gate of the other one of the fourth transistor and the fifth transistor is connected to the first node, a second electrode of the fourth transistor is connected to a first electrode of the fifth transistor, and a second electrode of the fifth transistor is connected to the fourth node.

In some embodiments, the inverter sub-circuit is further connected to the first power supply terminal and is configured to control the potential at the fourth node in response to the first power supply signal.

In some embodiments, the inverter sub-circuit further comprises: a second capacitor; wherein a first terminal of the second capacitor is connected to the first power supply terminal, and a second terminal of the second capacitor is connected to the first electrode of the fourth transistor.

In some embodiments, the output circuit comprises a first output sub-circuit and a second output sub-circuit; wherein the first output sub-circuit is connected to the second node, the fourth node, the first power supply terminal, the second power supply terminal and the first output terminal, and is configured to control conduction/non-conduction between the first power supply terminal and the first output terminal in response to the potential at the second node, and control conduction/non-conduction between the second power supply terminal and the first output terminal in response to the potential at the fourth node; and the second output sub-circuit is connected to the second node, the fourth node, the first power supply terminal, the second power supply terminal and the second output terminal, and is configured to control conduction/non-conduction between the second power supply terminal and the second output terminal in response to the potential at the second node, and control conduction/non-conduction between the first power supply terminal and the second output terminal in response to the potential at the fourth node.

In some embodiments, the first output sub-circuit comprises a sixth transistor, a seventh transistor, a third capacitor and a fourth capacitor; wherein a gate of the sixth transistor is connected to the second node, a first electrode of the sixth transistor is connected to the first power supply terminal, and a second electrode of the sixth transistor is connected to the first output terminal;

a gate of the seventh transistor is connected to the fourth node, a first electrode of the seventh transistor is connected to the second power supply terminal, and a second electrode of the seventh transistor is connected to the first output terminal;

a first terminal of the third capacitor is connected to the second node, and a second terminal of the third capacitor is connected to the first electrode of the sixth transistor; and a first terminal of the fourth capacitor is connected to the fourth node, and a second terminal of the fourth capacitor is connected to the first electrode of the seventh transistor;

the second output sub-circuit comprises an eighth transistor and a ninth transistor; wherein a gate of the eighth transistor is connected to the second node, a first electrode of the eighth transistor is connected to the second power supply terminal, and a second electrode of the eighth transistor is connected to the second output terminal; and a gate of the ninth transistor is connected to the fourth node, a first electrode of the ninth transistor is connected to the first power supply terminal, and a second electrode of the ninth transistor is connected to the second output terminal.

In some embodiments, the first input circuit comprises a tenth transistor; wherein a gate of the tenth transistor is connected to the first control terminal, a first electrode of the tenth transistor is connected to the turn-on signal terminal, and a second electrode of the tenth transistor is connected to the first node and the second node;

the second input circuit comprises an eleventh transistor; wherein a gate of the eleventh transistor is connected to the first node, a first electrode of the eleventh transistor is connected to the first power supply terminal, and a second electrode of the eleventh transistor is connected to the third node.

In some embodiments, the first input circuit is further connected to the first power supply terminal, and is configured to control the potential at the first node and the potential at the second node in response to the first control signal, the turn-on signal and the first power supply signal; and the second input circuit is further connected to the first control terminal, and is configured to control the potential at the third node in response to the potential at the first node, the first power supply signal and the first control signal.

In some embodiments, the first input circuit comprises a tenth transistor and a twelfth transistor; wherein a gate of the tenth transistor is connected to the first control terminal, a first electrode of the tenth transistor is connected to the turn-on signal terminal, and a second electrode of the tenth transistor is connected to the first node; and a gate of the twelfth transistor is connected to the first power supply terminal, a first electrode of the twelfth transistor is connected to the first node, and a second electrode of the twelfth transistor is connected to the second node;

the second input circuit comprises an eleventh transistor and a thirteenth transistor; wherein a gate of the eleventh transistor is connected to the first node, a first electrode of the eleventh transistor is connected to the first control terminal, and a second electrode of the eleventh transistor is connected to the third node; and a gate of the thirteenth transistor is connected to the first control terminal, a first electrode of the thirteenth transistor is connected to the first power supply terminal, and a second electrode of the thirteenth transistor is connected to the third node.

In some embodiments of the present disclosure, a method for driving a shift register unit is provided. The method is applicable for driving the shift register unit as described in the above embodiments. The method includes:

in an input phase during which a potential of a turn-on signal provided by a turn-on signal terminal and a potential of a first control signal provided by a first control terminal are a first potential, a potential of a second control signal provided by a second control terminal is a second potential, controlling, by a first input circuit, a potential at a first node and a potential at a second node to be the first potential in response to the first control signal and the turn-on signal; controlling, by a second input circuit, a potential at a third node to be the first potential in response to the potential at the first node and a first power supply signal provided by a first power supply terminal; controlling, by an output control circuit, a potential at a fourth node to be the second potential in response to the potential at the first node, the potential at the second node, the potential at the third node and the second control signal; and controlling, by an output circuit, the first power supply terminal and a second power supply terminal to transmit the first power supply signal and a second power supply signal at the second potential to a first output terminal and a second output terminal respectively, in response to the potential at the second node and the potential at the fourth node; and in an output phase during which the potential of the second control signal is the first potential, the potential of the turn-on signal, the potential of the second power supply signal and the potential of the first control signal are all the second potential, controlling, by the first input circuit, the potential at the first node and the potential at the second node to be the second potential in response to the first control signal and the turn-on signal; controlling, by the second input circuit, the potential at the third node to be the first potential in response to the potential at the first node and the first power supply signal; controlling, by the output control circuit, the potential at the fourth node to be the first potential in response to the potential at the first node, the potential at the second node, the potential at the third node and the second control signal; and controlling, by the output circuit, the second power supply terminal and the first power supply terminal to transmit the first power supply signal and the second power supply signal to the first output terminal and the second output terminal respectively, in response to the potential at the second node and the potential at the fourth node.

In some embodiments of the present disclosure, a gate drive circuit is provided. The gate drive circuit includes: at least two cascaded shift register units as described in the above embodiments.

In some embodiments of the present disclosure, a display device is provided. The display device includes: a display panel, a plurality of pixels disposed on the display panel, and the gate drive circuit as described in the above aspect, wherein each of the plurality of pixels comprises an N-type transistor and a P-type transistor; wherein in the gate drive circuit, a first output terminal of at least one shift register unit is connected to at least one N-type transistor in the plurality of pixels, and is configured to provide a gate driving signal to the at least one N-type transistor; and in the gate drive circuit, a second output terminal of the at least one shift register unit is connected to at least one P-type transistor in the plurality of pixels, and is configured to provide the gate driving signal to the at least one P-type transistor.

In some embodiments, a material of the N-type transistor comprises an oxide material, and a material of the P-type transistor comprises a low temperature poly-silicon material

BRIEF DESCRIPTION OF DRAWINGS

For a clearer description of the technical solutions in the embodiments of the present disclosure, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort.

FIG. 10 is a flowchart of a method for driving a shift register unit according to some embodiments of the present disclosure;

DETAILED DESCRIPTION

Figure 1:
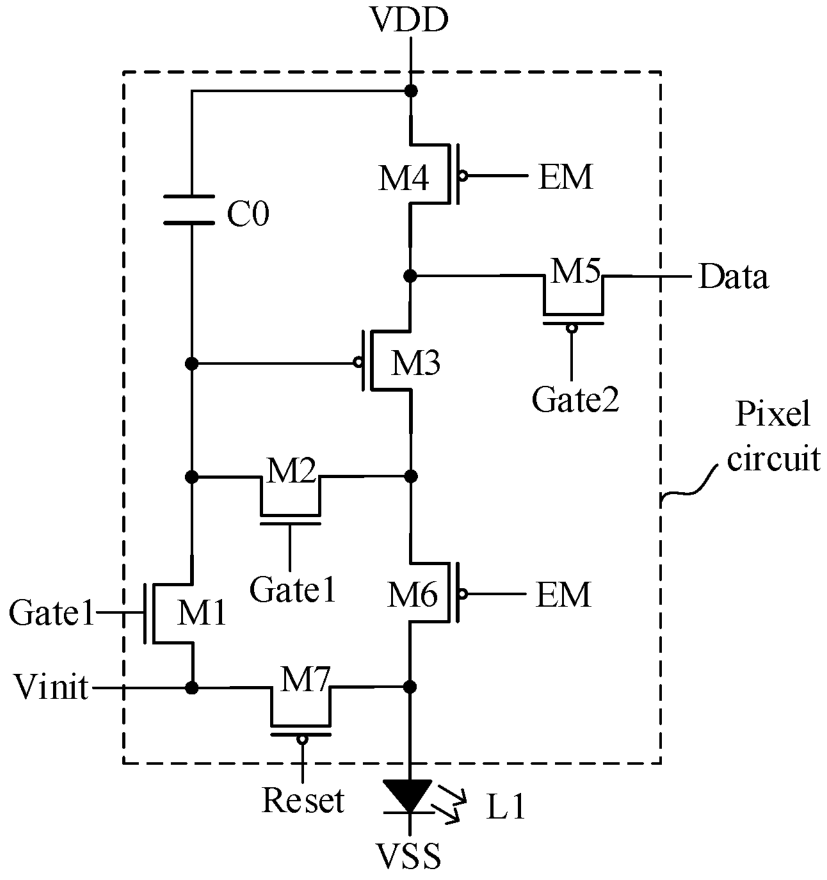
FIG. 1 is a circuit structure diagram of a pixel provided according to some embodiments of the present disclosure.

To make the objects, technical solutions, and advantages of the present disclosure clearer, the embodiments of the present disclosure are further described in detail hereinafter with reference to the accompanying drawings.

Transistors used in all the embodiments of the present disclosure are thin film transistors or field-effect transistors or other devices with the same characteristics. The transistors used in the embodiments of the present disclosure are mainly switching transistors according to the functions in the circuit. Since a source and a drain of the switching transistor used here are symmetrical, the source and the drain are interchangeable. In the embodiments of the present disclosure, the source is referred to as a first electrode and the drain is referred to as a second electrode, or the drain is referred to as a first electrode and the source is referred to as a second electrode. According to the form in the drawings, an intermediate terminal of the transistor is a gate, a signal input terminal is the source, and a signal output terminal is the drain. In addition, the switching transistors used in the embodiments of the present disclosure include any one of a P-type switching transistor and an N-type switching transistor. The P-type switching transistor is turned on when the gate is at a low level and is turned off when the gate is at a high level, and the N-type switching transistor is turned on when the gate is at a high level and turned off when the gate is at a low level. In addition, a plurality of signals in various embodiments of the present disclosure each correspond to a first potential and a second potential. The first potential and the second potential only represent that the signal has potentials with two different state quantities, but do not represent that the first potential or the second potential has a specific value in the whole text.

With the development of display technologies, the requirements on a narrow border and low power consumption of display products (especially display products with small and medium sizes) become increasing higher. It has been found through research that in order to effectively reduce the power consumption of the display product, the refresh rate needs to be reduced as much as possible when the display product displays a static picture, for example, the refresh rate is generally reduced to about 10 Hz. However, test results show that if all pixel circuits in the display product are P-type transistors, after the refresh rate is reduced, the electric leakage of the storage capacitor connected to the gate of the driving transistor in the pixel circuit leads to an abnormal display of the display picture, such as flicker. Therefore, it can be found that the electric leakage amount of the storage capacitor needs to be reduced as much as possible in order to guarantee a relatively good picture quality while reducing the refresh rate. At present, in most of the designs, the transistor connected to the storage capacitor in the pixel circuit is replaced with an N-type transistor with a smaller electric leakage, and the other transistors still adopt P-type transistors. The N-type transistor is generally made of an oxide.

For example, referring to FIG. 1, which shows a circuit structure diagram of an improved pixel circuit. The pixel circuit has a 7T1C structure (i.e., includes 7 transistors M1 to M7 and 1 storage capacitor C0). In addition, the two transistors M1 and M2 connected to the storage capacitor C0 are N-type transistors made of an oxide material, and the other transistors M3 to M7 are P-type transistors.

The transistor M0 is connected to an initial power supply terminal Vinit, a first gate signal terminal Gate1, and the gate of the transistor M3, and is configured to control the conduction/non-conduction between the gate of the transistor M3 and the initial power supply terminal Vinit in response to a first gate signal provided by the first gate signal terminal Gate1. The transistor M2 is connected to the first gate signal terminal Gate1, the gate of the transistor M3, and the second electrode of the transistor M3, and is configured to control the conduction/non-conduction between the gate and the second electrode of the transistor M3 in response to the first gate signal. The transistor M4 is connected to a light emission control terminal EM, a charging power supply terminal VDD, and the first electrode of the transistor M3, and is configured to control conduction/non-conduction between the first electrode of the transistor M3 and the charging power supply terminal VDD in response to a light emission control signal provided by the light emission control terminal EM. The transistor M5 is connected to a second gate signal terminal Gate2, a data signal terminal Data, and the first electrode of the transistor M3, and is configured to control the conduction/non-conduction between the first electrode of the transistor M3 and the data signal terminal Data in response to a gate driving signal provided by the second gate signal terminal Gate2. The transistor M6 is connected to the light emission control terminal EM, the second electrode of the transistor M3, and an anode of a light-emitting element L1, and is configured to control the conduction/non-conduction between the second electrode of the transistor M3 and the anode of the light-emitting element L1 in response to the light emission control signal. The transistor M7 is connected to a reset signal terminal Reset, the initial power supply terminal Vinit, and the anode of the light-emitting element L1, and is configured to control the conduction/non-conduction between the anode of the light-emitting element L1 and the initial power supply terminal Vinit in response to a reset signal provided by the reset signal terminal Reset. The cathode of the light-emitting element L1 is further connected to a pull-down power supply terminal VSS. After the transistors M3, M4, and M6 are turned on, a light emission driving signal (for example, a driving current) is transmitted to the light-emitting element L1, and the light-emitting element L1 emits light under the action of a voltage difference between the light emission driving signal and a pull-down power supply signal provided by the pull-down power supply terminal VSS. In the embodiments of the present disclosure, the connection refers to an electrical connection, such as "coupled".

With reference to FIG. 1, the transistors M1 and M2 connected to the first gate signal terminal Gate1 are both N-type transistors, the transistor M5 connected to the second gate signal terminal Gate2 is a P-type transistor, and the N-type transistor and the P-type transistor are turned on in response to gate driving signals with different potentials, that is, the first gate driving signal is different from the second gate driving signal. Therefore, at present, it is necessary to provide two shift register units to be connected to each pixel circuit. An output terminal of one of the two shift register units is connected to the P-type transistor (e.g., transistor M5) in the pixel circuit to provide a gate driving signal to the P-type transistor, and an output terminal of the other shift register unit is connected to the N-type transistors (e.g., transistors M1 and M2) in the pixel circuit to provide a gate driving signal to the N-type transistors. However, such a design occupies more layout area of the display product, and thus the width of the border is increased, which is not conducive to the design of the narrow border, that is, such as design is against the original intention of the design of the narrow border.

In view of the above, the embodiments of the present disclosure provide a new shift register unit. The new shift register unit can simultaneously output two reverse gate driving signals, that is, simultaneously provide required gate driving signals to the P-type transistor and the N-type transistor respectively, which facilitates the narrow border design on the premise of ensuring the low power consumption and good picture quality. Therefore, the requirements on the narrow border and low power consumption of display products at present are fully met.

Figure 2:
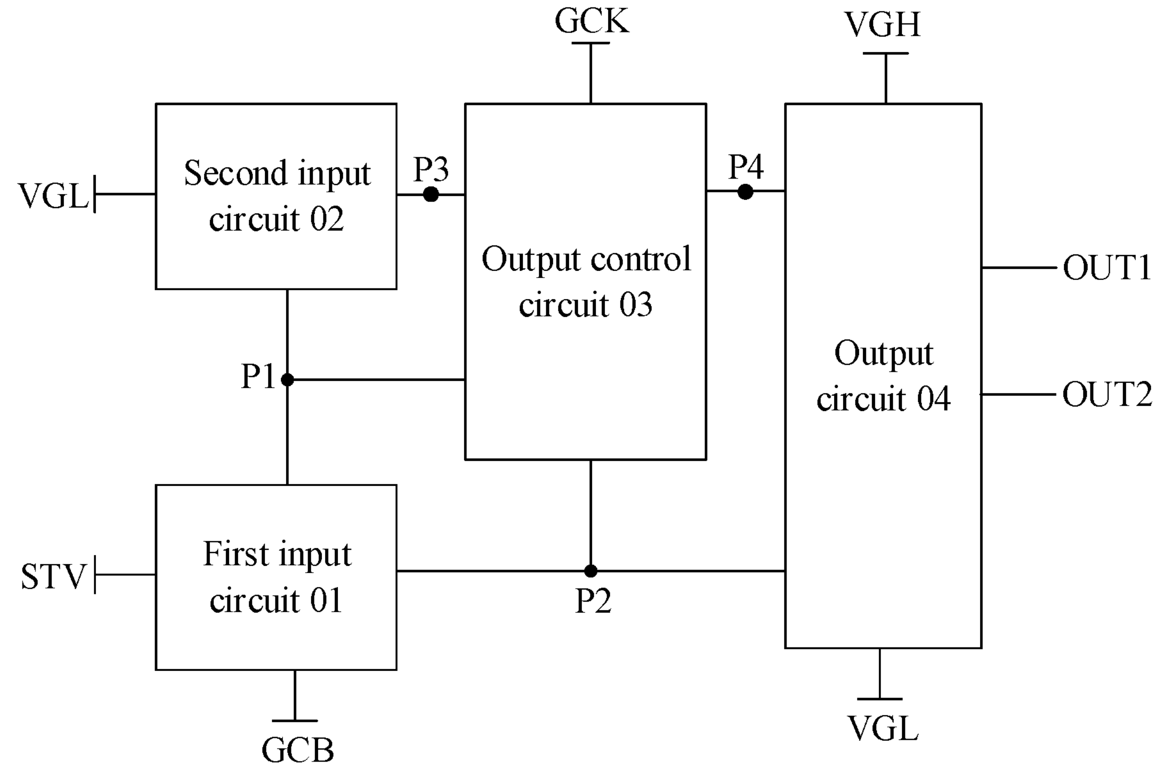
FIG. 2 is a schematic structural diagram of a shift register unit according to some embodiments of the present disclosure.

FIG. 2 is a schematic structural diagram of a shift register unit according to some embodiments of the present disclosure. As shown in FIG. 2, the shift register unit includes a first input circuit 01, a second input circuit 02, an output control circuit 03, and an output circuit 04.

The first input circuit 01 is connected to a first control terminal GCB, a turn-on signal terminal STV, a first node P1 and a second node P2. The first input circuit 01 is configured to control a potential at the first node P1 and a potential at the second node P2 in response to a first control signal provided by the first control terminal GCB and a turn-on signal provided by the turn-on signal terminal STV.

For example, the first control terminal GCB is a clock signal terminal, that is, the first control signal is a first clock signal. The first input circuit 01 controls the conduction/non-conduction between the turn-on signal terminal STV and each of the first node P1 and the second node P2 in response to the first clock signal, so as to indirectly control the potential at the first node P1 and the potential at the second node P2.

In some embodiments, the first input circuit 01 controls the turn-on signal terminal STV to be conducted with both the first node P1 and the second node P2 when the potential of the first control signal provided by the first control terminal GCB is a first potential. In this case, the turn-on signal provided by the turn-on signal terminal STV is transmitted (also referred to as "written") to the first node P1 and the second node P2, and the potential at the first node P1 and the potential at the second node P2 are the same as the potential of the turn-on signal. In addition, the first input circuit 01 controls the turn-on signal terminal STV to be non-conducted with both the first node P1 and the second node P2 when the potential of the first control signal is a second potential. In this case, the turn-on signal provided by the turn-on signal terminal STV cannot be transmitted to the first node P1 and the second node P2.

In the embodiments of the present disclosure, for various circuits in the shift register unit, the first potential is an effective potential, the second potential is an ineffective potential, and the first potential is a low potential relative to the second potential. That is, the first potential is lower than the second potential.

The second input circuit 02 is connected to a first power supply terminal VGL, the first node P1 and a third node P3. The second input circuit 02 is configured to control a potential at the third node P3 in response to the potential at the first node P1 and a first power supply signal provided by the first power supply terminal VGL.

For example, the second input circuit 02 controls the first power supply terminal VGL to be conducted with the third node P3 when the potential at the first node P1 is the first potential. In this case, the first power supply signal provided by the first power supply terminal VGL is transmitted to the third node P3, and the potential at the third node P3 is the same as the potential of the first power supply signal. In addition, the second input circuit 02 controls the first power supply terminal VGL to be non-conducted with the third node P3 when the potential at the first node P1 is the second potential. In this case, the first power supply signal provided by the first power supply terminal VGL cannot be transmitted to the third node P3.

The output control circuit 03 is connected to the first node P1, the second node P2, the third node P3, a second control terminal GCK and a fourth node P4. The output control circuit 03 is configured to control a potential at the fourth node P4 in response to the potential at the first node P1, the potential at the second node P2, the potential at the third node P3, and a second control signal provided by the second control terminal GCK.

For example, the second control terminal GCK is a clock signal terminal, that is, the second control signal is a second clock signal. The output control circuit 03 is further connected to a third control terminal, and controls the conduction/non-conduction between the third control terminal and the fourth node P4 in response to the potential at the first node P1, the potential at the second node P2 and the potential at the third node P3, and controls the conduction/non-conduction between the third node P3 and the fourth node P4 in response to the second control signal. The third control terminal is the second control terminal GCK, or a second power supply terminal VGH.

In some embodiments, the output control circuit 03 controls the second control terminal GCK to be conducted with the fourth node P4 when the potential at the first node P1, the potential at the second node P2 and the potential at the third node P3 are all the first potential. In this case, the second control signal is transmitted to the fourth node P4, and the potential at the fourth node P4 is the same as the potential of the second control signal. In addition, the output control circuit 03 controls the second control terminal GCK to be non-conducted with the fourth node P4 when the potential at the first node P1, the potential at the second node P2, and/or the potential at the third node P3 are the second potential. In this case, the second control signal cannot be transmitted to the fourth node P4.

Similarly, the output control circuit 03 controls the third node P3 to be conducted with the fourth node P4 when the potential of the second control signal provided by the second control terminal GCK is the first potential. In this case, the potential at the third node P3 is transmitted to the fourth node P4, and the potential at the fourth node P4 is the same as the potential at the third node P3. In addition, the output control circuit 03 controls the third node P3 to be non-conducted with the fourth node P4 when the potential of the second control signal provided by the second control terminal GCK is the second potential. In this case, the potential at the third node P3 cannot be transmitted to the fourth node P4. It should be noted that when the potential at the third node P3 is also the first potential, the potential transmitted to the fourth node P4 is the potential of the second control signal.

The output circuit 04 is connected to the second node P2, the fourth node P4, the first power supply terminal VGL, the second power supply terminal VGH, a first output terminal OUT1 and a second output terminal OUT2. The output circuit 04 is configured to control, in response to the potential at the second node P2 and the potential at the fourth node P4, the first power supply terminal VGL and the second power supply terminal VGH to transmit the first power supply signal and the second power supply signal to the first output terminal OUT1 and the second output terminal OUT2 respectively in at least one same time period.

The same time period is one clock cycle or any moment. That is, the output circuit 04 transmits the first power supply signal and the second power supply signal to the first output terminal OUT1 and the second output terminal OUT2 respectively in one clock cycle, or the output circuit 04 transmits the first power supply signal and the second power supply signal to the first output terminal OUT1 and the second output terminal OUT2 respectively at the same moment. The embodiments of the present disclosure are illustrated by taking an example in which the output circuit 04 transmits the first power supply signal and the second power supply signal to the first output terminal OUT1 and the second output terminal OUT2 respectively at the same moment. Here, the clock cycle refers to the clock cycle of the first clock signal or the clock cycle of the second clock signal.

For example, the output circuit 04 controls, in response to the potential at the second node P2, the conduction/non-conduction between the first power supply terminal VGL and the first output terminal OUT and the conduction/non-conduction between the second power supply terminal VGH and the second output terminal OUT2, and controls, in response to the potential at the fourth node P4, the conduction/non-conduction between the second power supply terminal VGH and the first output terminal OUT1 and the conduction/non-conduction between the first power supply terminal VGL and the second output terminal OUT2.

In some embodiments, when the potential at the second node P2 is the first potential, the output circuit 04 controls the first power supply terminal VGL to be conducted with the first output terminal OUT1 and controls the second power supply terminal VGH to be conducted with the second output terminal OUT2. In this case, the first power supply signal provided by the first power supply terminal VGL is transmitted to the first output terminal OUT1, and the second power supply signal provided by the second power supply terminal VGH is transmitted to the second output terminal OUT2. When the potential at the second node P2 is the second potential, the output circuit 04 controls the first power supply terminal VGL to be non-conducted with the first output terminal OUT1 and controls the second power supply terminal VGH to be non-conducted with the second output terminal OUT2. In this case, the first power supply signal provided by the first power supply terminal VGL cannot be transmitted to the first output terminal OUT1, and the second power supply signal provided by the second power supply terminal VGH cannot be transmitted to the second output terminal OUT2.

Similarly, when the potential at the fourth node P4 is the first potential, the output circuit 04 controls the second power supply terminal VGH to be conducted with the first output terminal OUT1 and controls the first power supply terminal VGL to be conducted with the second output terminal OUT2. In this case, the second power supply signal provided by the second power supply terminal VGH is transmitted to the first output terminal OUT1, and the first power supply signal provided by the first power supply terminal VGL is transmitted to the second output terminal OUT2. When the potential at the fourth node P4 is the second potential, the output circuit 04 controls the second power supply terminal VGH to be non-conducted with the first output terminal OUT1 and controls the first power supply terminal VGL to be non-conducted with the second output terminal OUT2. In this case, the second power supply signal provided by the second power supply terminal VGH cannot be transmitted to the first output terminal OUT1, and the first power supply signal provided by the first power supply terminal VGL cannot be transmitted to the second output terminal OUT2.

In the embodiments of the present disclosure, the potential of the first power supply signal is lower than the potential of the second power supply signal. For example, the potential of the first power supply signal maintains a low potential, and the potential of the second power supply signal maintains a high potential. Therefore, the potentials of the signals provided by the signal terminals (including the first control terminal GCB, the second control terminal GCK and the turn-on signal terminal STV) can be flexibly set, such that only the potential at the second node P2 or the potential at the fourth node P4 is the first potential at the same time. That is, the output circuit 04 operates in response to the potential at the second node P2 only or the potential of the fourth node P4 only in the same time period, and transmits the first power supply signal and the second power supply signal at different potentials to the first output terminal OUT1 and the second output terminal OUT2, respectively.

When the potential at the second node P2 is the first potential, the output circuit 04 controls the first power supply terminal VGL to be conducted with the first output terminal OUT1, and controls the second power supply terminal VGH to be conducted with the second output terminal OUT2. In this case, the output circuit 04 transmits the first power supply signal from the first power supply terminal VGL to the first output terminal OUT1 and transmits the second power supply signal from the second power supply terminal VGH to the second output terminal OUT2 simultaneously. Similarly, when the potential at the fourth node P4 is the first potential, the output circuit 04 controls the second power supply terminal VGH to be conducted with the first output terminal OUT1, and controls the first power supply terminal VGL to be conducted with the second output terminal OUT2. In this case, the output circuit 04 transmits the second power supply signal from the second power supply terminal VGH to the first output terminal OUT1, and transmits the first power supply signal from the first power supply terminal VGL to the second output terminal OUT2 simultaneously. That is, the output circuit 04 simultaneously transmits the first power supply signal at the low potential and the second power supply signal at the high potential to the first output terminal OUT1 and the second output terminal OUT2, respectively.

Therefore, with reference to FIG. 1, in the shift register unit, the first output terminal OUT1 is connected to the N-type transistors (e.g., the transistors M1 and M2) configured to receive the gate driving signal in the pixel circuit, and the second output terminal OUT2 is connected to the P-type transistor (e.g., the transistor M5) configured to receive the gate driving signal in the pixel circuit, so as to drive the pixel circuit reliably. Because the required gate driving signals can be provided to the N-type transistors and the P-type transistors in one pixel circuit at the same time by providing only one shift register unit, compared with the existing arrangement where two shift register units are provided for each pixel circuit, the occupied layout area is effectively reduced, which is conducive to the narrow border design of the display device.

In some embodiments, taking the first control signal being the first clock signal and the second control signal being the second clock signal as an example, in the embodiments of the present disclosure, the first clock signal and the second clock signal have the same the frequency, that is, the same cycle. For example, the duty cycle of the first clock signal and the duty cycle of the second clock signal both range from twenty percent (20%) to forty percent (40%). In some embodiments, in each cycle, an interval between a falling edge of the first clock signal and a falling edge of the second clock signal is about ½ cycle. Certainly, in some other embodiments, the timing of the first clock signal and the timing of the second clock signal are strictly opposite, that is, when the potential of the first clock signal is the first potential, the potential of the second clock signal is the second potential; and when the potential of the first clock signal is the second potential, the potential of the second clock signal is the first potential.

In summary, the embodiments of the present disclosure provide a shift register unit. In the shift register unit, the first input circuit controls the potential at the first node and the potential at the second node in response to the first control signal provided by the first control terminal and the turn-on signal provided by the turn-on signal terminal. The second input circuit controls the potential at the third node in response to the potential at the first node and the first power supply signal provided by the first power supply terminal. The output control circuit controls the potential at the fourth node in response to the potential at the first node, the potential at the second node, the potential at the third node, and the second control signal provided by the second control terminal. The output circuit controls, in response to the potential at the second node and the potential at the fourth node, the first power supply terminal and the second power supply terminal to transmit the first power supply signal and the second power supply signal to the first output terminal and the second output terminal respectively at least within one same time period. In this way, the potential at the second node and the potential at the fourth node can be adjusted by flexibly setting the first control signal, the second control signal and the turn-on signal, such that the output circuit can simultaneously transmit the first power supply signal and the second power supply signal at different potentials to the first output terminal and the second output terminal respectively, that is, the shift register unit can simultaneously transmit the gate driving signals at different potentials to one pixel, so as to meet the requirement that one pixel emits light in response to a plurality of gate driving signals at different potentials. Therefore, compared with the related art, the number of the gate drive circuits required to be arranged is reduced, which is conducive to the narrow border design of the display device.

Figure 3:
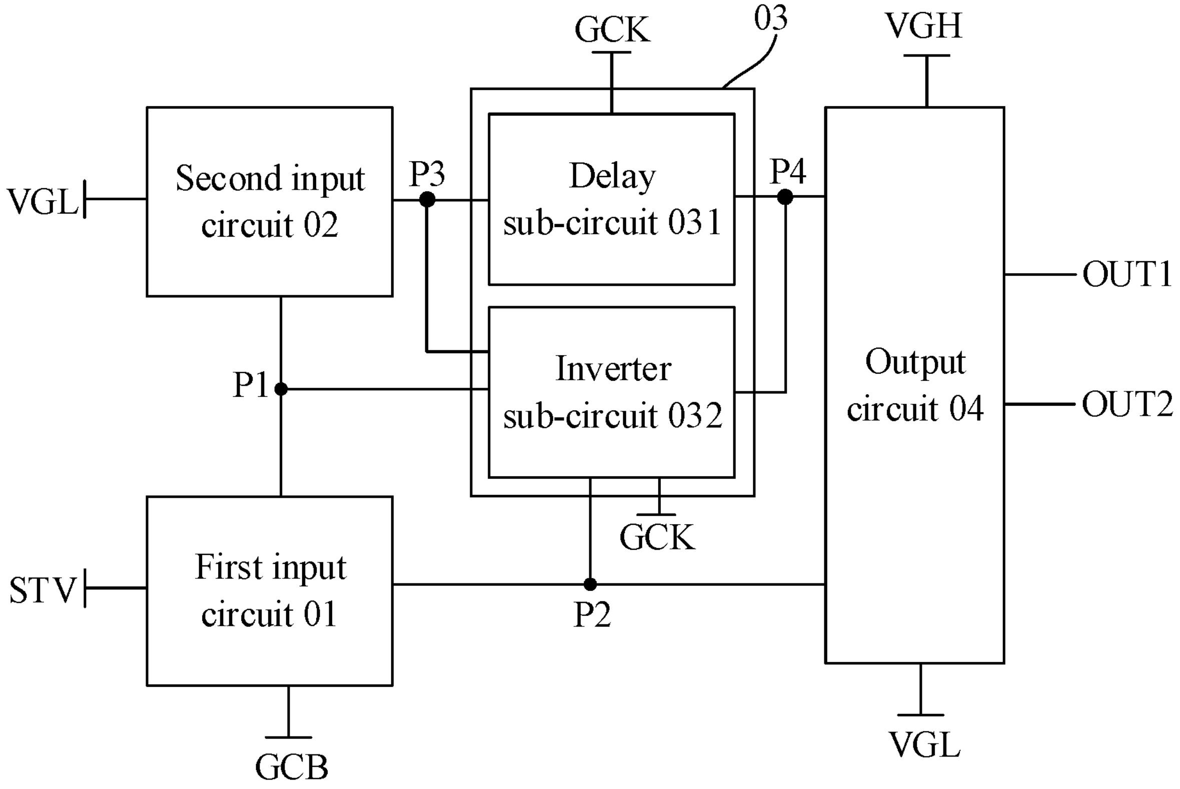
FIG. 3 is a schematic structural diagram of another shift register unit according to some embodiments of the present disclosure.

FIG. 3 is a schematic structural diagram of another shift register unit according to some embodiments of the present disclosure. As shown in FIG. 3, the output control circuit 03 includes a delay sub-circuit 031 and an inverter sub-circuit 032.

The delay sub-circuit 031 is connected to the third node P3, the second control terminal GCK, and the fourth node P4. The delay sub-circuit 031 is configured to control the conduction/non-conduction between the third node P3 and the fourth node P4 in response to the second control signal (for example, the second clock signal).

For example, the delay sub-circuit 031 controls the third node P3 to be conducted with the fourth node P4 when the potential of the second control signal is the first potential; and the delay sub-circuit 031 controls the third node P3 to be non-conducted with the fourth node P4 when the potential of the second control signal is the second potential. In this way, transmission of the potential at the third node P3 to the fourth node P4 can be delayed by flexibly controlling the potential of the second control signal.

The inverter sub-circuit 032 is connected to the first node P1, the second node P2, the third node P3, the fourth node P4 and the third control terminal. The inverter sub-circuit 032 is configured to control the conduction/non-conduction between the third control terminal and the fourth node P4 in response to the potential at the first node P1, the potential at the second node P2, and the potential at the third node P3.

For example, the third control terminal is the second control terminal GCK shown in FIG. 3. Certainly, in some other embodiments, the third control terminal is the second power supply terminal VGH. The inverter sub-circuit 032 controls the second control terminal GCK to be conducted with the fourth node P4 when the potential at the first node P1, the potential at the second node P2 and the potential at the third node P3 are all the first potential; and the inverter sub-circuit 032 controls the second control terminal GCK to be non-conducted with the fourth node P4 when the potential at the first node P1, the potential at the second node P2, and/or the potential at the third node P3 are the second potential. In this way, by flexibly controlling the potential at each node and the potential of the second control signal, the potential at the second node P2 and the potential at the fourth node P4 are enabled to be opposite in the same time period, such that the output circuit 04 can transmit the first power supply signal and the second power supply signal at different potentials to the first output terminal OUT1 and the second output terminal OUT2 respectively in response to the potential at the second node P2 only or in response to the potential at the fourth node P4 only. Opposite potentials refer to that in the second node P2 and the fourth node P4, one node has a high potential, and the other node has a low potential.

Figure 4:
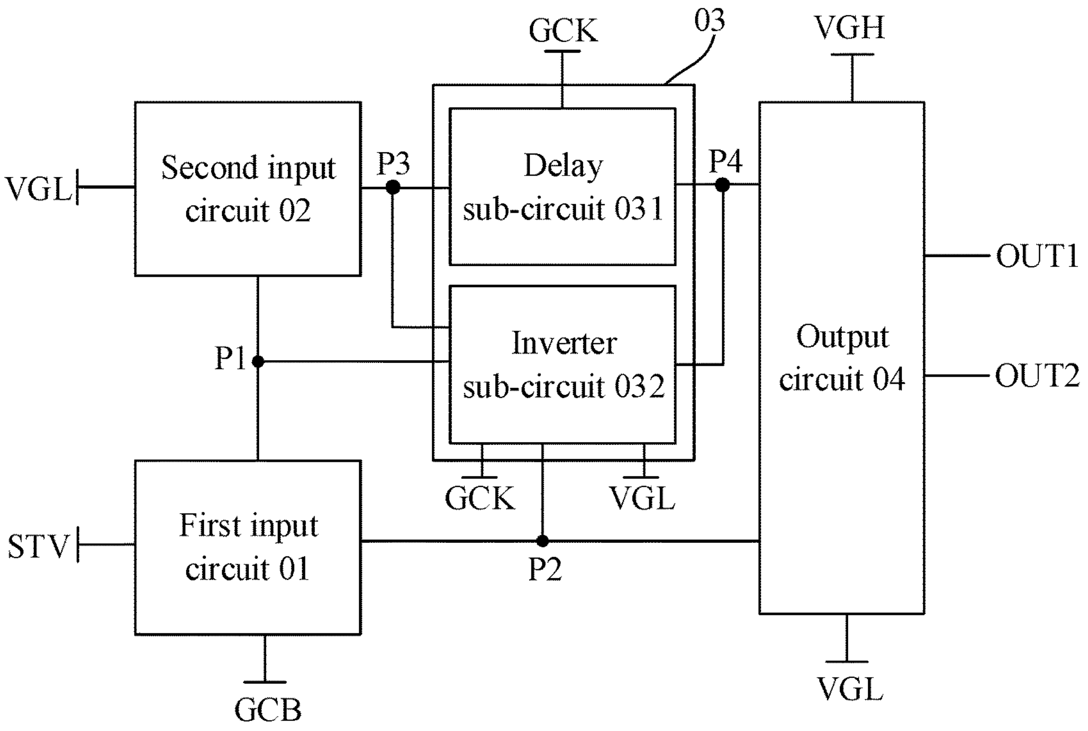
FIG. 4 is a schematic structural diagram of yet another shift register unit according to some embodiments of the present disclosure.

FIG. 4 is a schematic structural diagram of still another shift register unit according to some embodiments of the present disclosure. As shown in FIG. 4, the inverter sub-circuit 032 described in the embodiments of the present disclosure is further connected to the first power supply terminal VGL. On this basis, the inverter sub-circuit 032 is configured to control the potential at the fourth node P4 in response to the first power supply signal.

Figure 5:
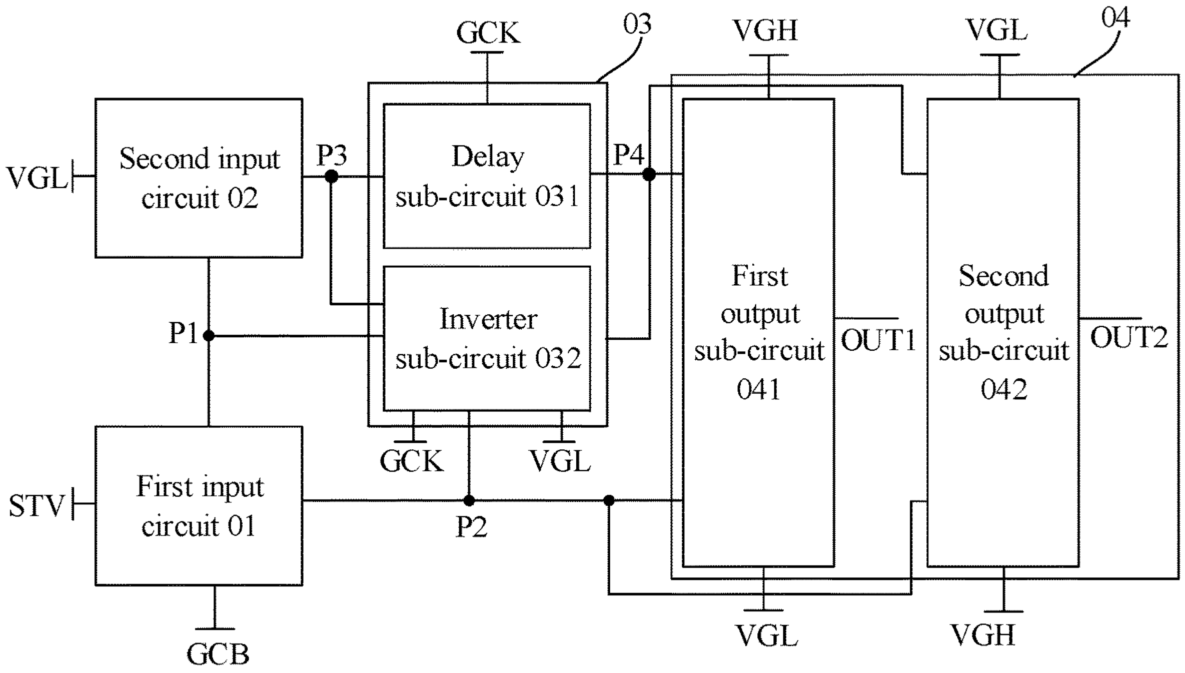
FIG. 5 is a schematic structural diagram of still another shift register unit according to some embodiments of the present disclosure.

FIG. 5 is a schematic structural diagram of yet still another shift register unit according to some embodiments of the present disclosure. As shown in FIG. 5, the output circuit 04 includes a first output sub-circuit 041 and a second output sub-circuit 042.

The first output sub-circuit 041 is connected to the second node P2, the fourth node P4, the first power supply terminal VGL, the second power supply terminal VGH and the first output terminal OUT1. The first output sub-circuit 041 is configured to control the conduction/non-conduction between the first power supply terminal VGL and the first output terminal OUT1 in response to the potential at the second node P2, and control the conduction/non-conduction between the second power supply terminal VGH and the first output terminal OUT1 in response to the potential at the fourth node P4.

For example, the first output sub-circuit 041 controls the first power supply terminal VGL to be conducted with the first output terminal OUT1 when the potential at the second node P2 is the first potential, and controls the first power supply terminal VGL to be non-conducted with the first output terminal OUT1 when the potential at the second node P2 is the second potential. Similarly, the first output sub-circuit 041 controls the second power supply terminal VGH to be conducted with the first output terminal OUT1 when the potential at the fourth node P4 is the first potential, and controls the second power supply terminal VGH to be non-conducted with the first output terminal OUT1 when the potential at the fourth node P4 is the second potential.

The second output sub-circuit 042 is connected to the second node P2, the fourth node P4, the first power supply terminal VGL, the second power supply terminal VGH and the second output terminal OUT2. The second output sub-circuit 042 is configured to control the conduction/non-conduction between the second power supply terminal VGH and the second output terminal OUT2 in response to the potential at the second node P2, and control the conduction/non-conduction between the first power supply terminal VGL and the second output terminal OUT2 in response to the potential at the fourth node P4.

For example, the second output sub-circuit 042 controls the second power supply terminal VGH to be conducted with the second output terminal OUT2 when the potential at the second node P2 is the first potential, and controls the second power supply terminal VGH to be non-conducted with the second output terminal OUT2 when the potential at the second node P2 is the second potential. Similarly, the second output sub-circuit 042 controls the first power supply terminal VGL to be conducted with the second output terminal OUT2 when the potential at the fourth node P4 is the first potential, and controls the first power supply terminal VGL to be non-conducted with the second output terminal OUT2 when the potential at the fourth node P4 is the second potential.

It can be further seen that the first output sub-circuit 041 and the second output sub-circuit 042 in the output circuit 04 can simultaneously transmit the first power supply signal at the low potential and the second power supply signal at the high potential to the first output terminal OUT1 and the second output terminal OUT2 respectively in response to the first potential at the second node P2 or the first potential at the fourth node P4, and the shift register unit including the output circuit 04 is applicable to a pixel including an N-type transistor and a P-type transistor.

Figure 6:
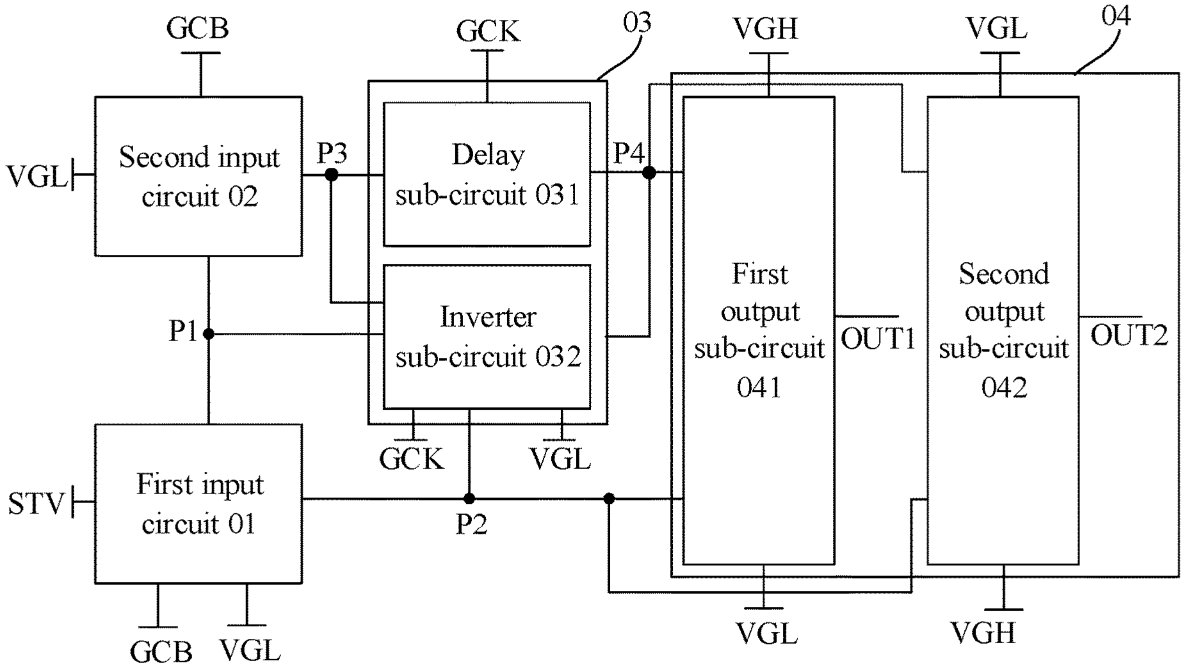
FIG. 6 is a schematic structural diagram of still another shift register unit according to some embodiments of the present disclosure.

FIG. 6 is a schematic structural diagram of yet still another shift register unit according to some embodiments of the present disclosure. As shown in FIG. 6, the first input circuit 01 described in the embodiments of the present disclosure is further connected to the first power supply terminal VGL. On this basis, the first input circuit 01 controls the potential at the first node P1 and the potential at the second node P2 in response to the first control signal, the turn-on signal and the first power supply signal.

For example, the first input circuit 01 is configured to control the conduction/non-conduction between the turn-on signal terminal STV and the first node P1 in response to the first control signal, and configured to control the conduction/non-conduction between the turn-on signal terminal STV and the second node P2 in response to the first control signal and the first power supply signal.

In some embodiments, the first input circuit 01 controls the turn-on signal terminal STV to be conducted with the first node P1 when the potential of the first control signal is the first potential, and controls the turn-on signal terminal STV to be non-conducted with the first node P1 when the potential of the first control signal is the second potential. In addition, the first input circuit 01 controls the turn-on signal terminal STV to be conducted with the second node P2 when the potential of the first control signal and the potential of the first power supply signal are both the first potential, and controls the turn-on signal terminal STV to be non-conducted with the second node P2 when the potential of the first control signal and/or the potential of the first power supply signal is the second potential. That is, the first input circuit 01 needs to control the conduction/non-conduction between the turn-on signal terminal STV and the second node P2 in response to the first control signal and the first power supply signal simultaneously, thereby ensuring a good reliability of controlling the potential at the second node P2.

In some embodiments, as can be seen from FIG. 6, the second input circuit 02 described in the embodiments of the present disclosure is further connected to the first control terminal GCB. On this basis, the second input circuit 02 controls the potential at the third node P3 in response to the potential at the first node P1, the first power supply signal and the first control signal.

For example, the second input circuit 02 controls the first control terminal GCB to be conducted with the third node P3 when the potential at the first node P1 is the first potential, and in this case, the first control signal is transmitted to the third node P3; and the second input circuit 02 controls the first control terminal GCB to be non-conducted with the third node P3 when the potential at the first node P1 is the second potential, and in this case, the first control signal cannot be transmitted to the third node P3. In addition, the second input circuit 02 controls the first power supply terminal VGL to be conducted with the third node P3 when the potential of the first control signal is the first potential, and in this case, the first power supply signal is transmitted to the third node P3; and the second input circuit 02 controls the first power supply terminal VGL to be non-conducted with the third node P3 when the potential of the first control signal is the second potential, and in this case, the first power supply signal cannot be transmitted to the third node P3.

Figure 7:
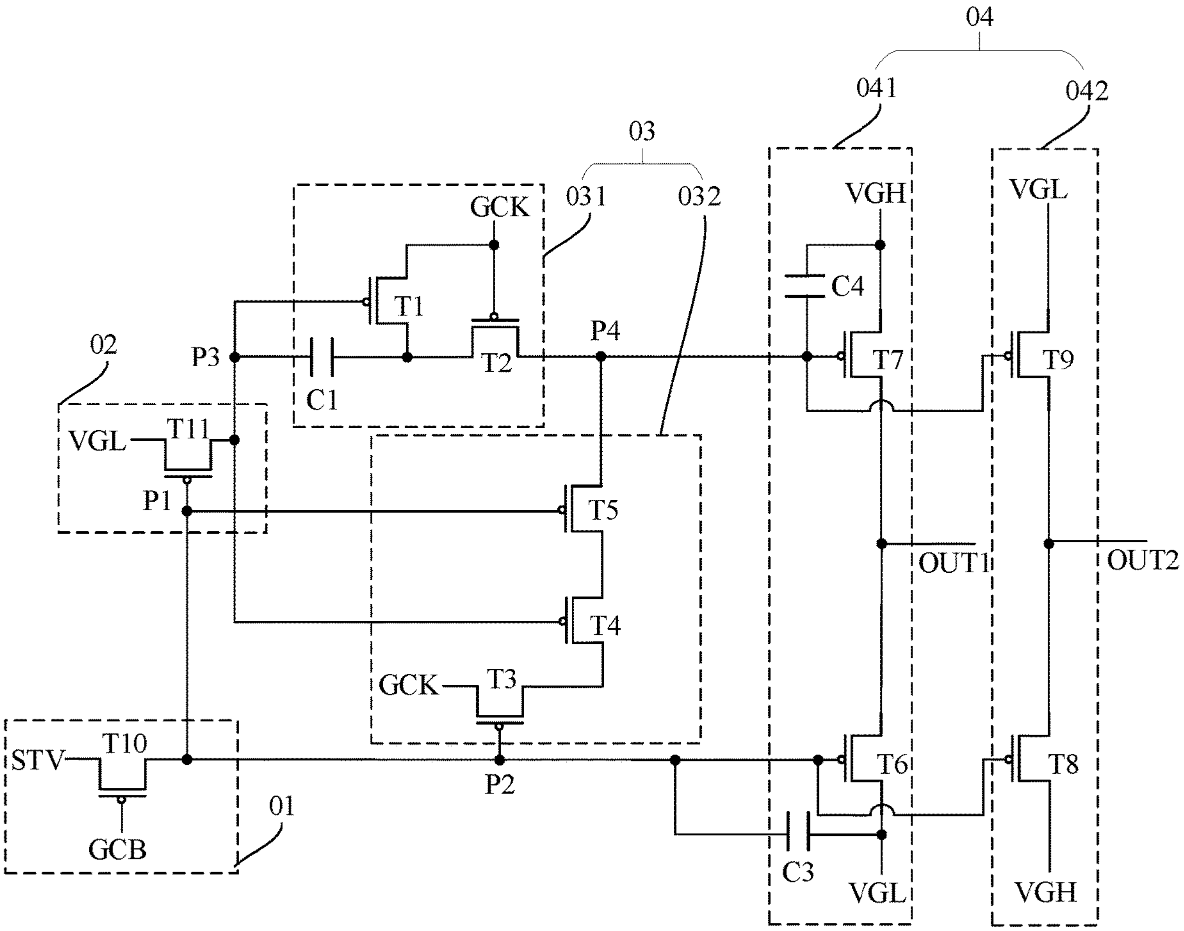
FIG. 7 is a circuit structure diagram of a shift register unit according to some embodiments of the present disclosure.

Taking the structures shown in FIG. 2 to FIG. 5 as an example, FIG. 7 shows a circuit structure diagram of a shift register unit. Taking the structure shown in FIG. 6 as an example, FIG. 8 shows a circuit structure diagram of another shift register unit.

Figure 8:
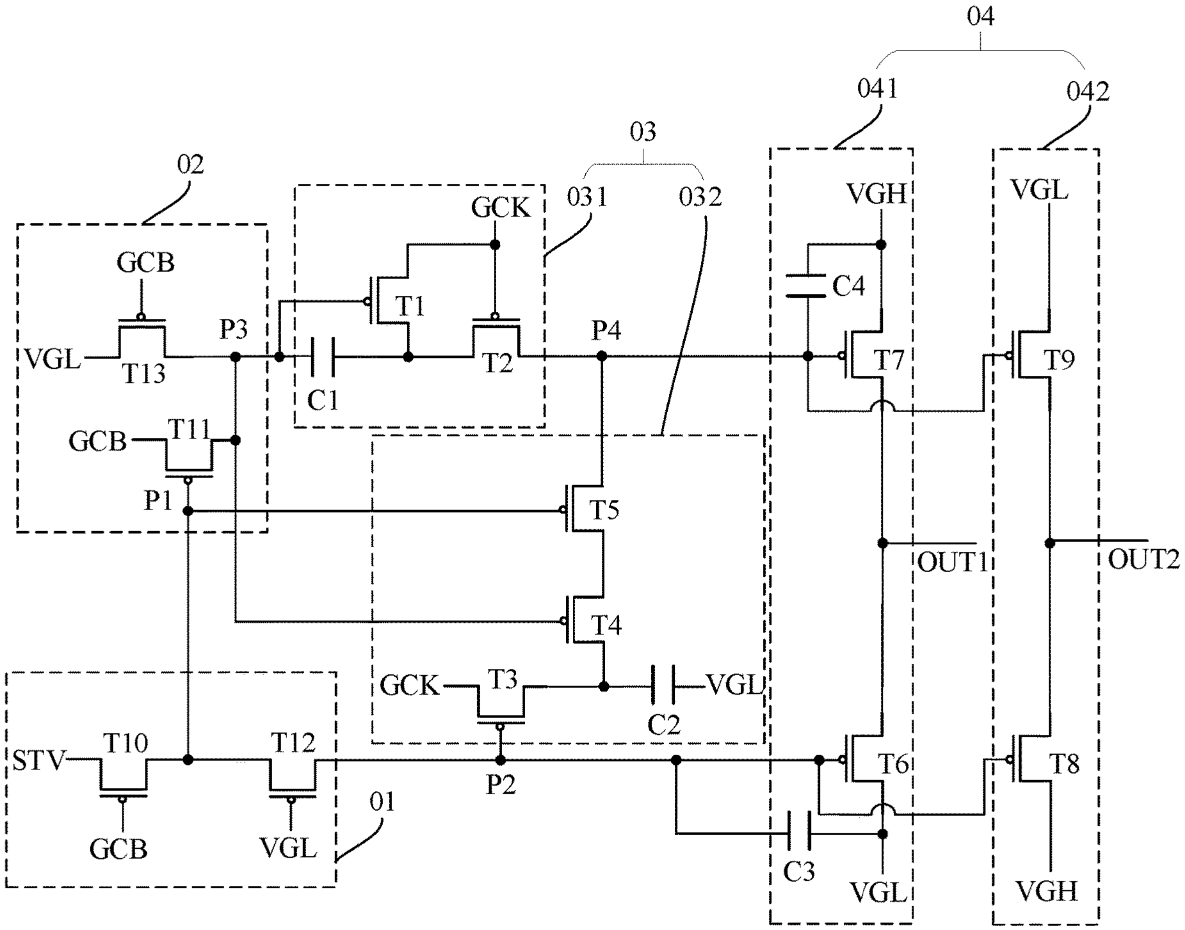
FIG. 8 is a circuit structure diagram of another shift register unit according to some embodiments of the present disclosure.

Referring to FIG. 7 and FIG. 8, it can be seen that the delay sub-circuit 031 described in the embodiments of the present disclosure includes a first transistor T1, a second transistor T2 and a first capacitor C1.

A gate of the first transistor T1 is connected to the third node P3, a first electrode of the first transistor T1 is connected to the second control terminal GCK, and a second electrode of the first transistor T1 is connected to a first electrode of the second transistor T2.

A gate of the second transistor T2 is connected to the second control terminal GCK, and a second electrode of the second transistor T2 is connected to the fourth node P4.

A first terminal of the first capacitor C1 is connected to the third node P3, and a second terminal of the first capacitor C1 is connected to the first electrode of the second transistor T2.

It can be seen from FIG. 7 and FIG. 8 that the inverter sub-circuit 032 described in the embodiments of the present disclosure includes a third transistor T3, a fourth transistor T4 and a fifth transistor T5.

A gate of the third transistor T3 is connected to the second node P2, a first electrode of the third transistor T3 is connected to the second control terminal GCK, and a second electrode of the third transistor T3 is connected to a first electrode of the fourth transistor T4.

A gate of one of the fourth transistor T4 and the fifth transistor T5 is connected to the third node P3, and a gate of the other one of the fourth transistor T4 and the fifth transistor T5 is connected to the first node P1. That is, with reference to the accompanying drawings, the gate of the fourth transistor T4 is connected to the third node P3, and the gate of the fifth transistor T5 is connected to the first node P1. Alternatively, the gate of the fourth transistor T4 is connected to the first node P1, and the gate of the fifth transistor T5 is connected to the third node P3. In addition, the second electrode of the fourth transistor T4 is connected to the first electrode of the fifth transistor T5. The second electrode of the fifth transistor T5 is connected to the fourth node P4.

In some embodiments, as described in the foregoing embodiments, the second control terminal GCK connected to the first electrode of the third transistor T3 is also replaced with the second power supply terminal VGH.

As can be seem from FIG. 8, on the premise that the inverter sub-circuit 032 is further connected to the first power supply terminal VGL, the inverter sub-circuit 032 described in the embodiments of the present disclosure further includes a second capacitor C2.

A first terminal of the second capacitor C2 is connected to the first power supply terminal VGL, and a second terminal of the second capacitor C2 is connected to the first electrode of the fourth transistor T4.

By providing the second capacitor C2 connected to the first power supply terminal VGL, the potential at the connection between the third transistor T3 and the fourth transistor T4 can be effectively stored, thereby ensuring that the inverter sub-circuit 032 effectively controls the potential at the fourth node P4.

As can be seen from FIG. 7 and FIG. 8, the first output sub-circuit 041 includes a sixth transistor T6, a seventh transistor T7, a third capacitor C3 and a fourth capacitor C4.

A gate of the sixth transistor T6 is connected to the second node P2, a first electrode of the sixth transistor T6 is connected to the first power supply terminal VGL, and a second electrode of the sixth transistor T6 is connected to the first output terminal OUT1.

A gate of the seventh transistor T7 is connected to the fourth node P4, a first electrode of the seventh transistor T7 is connected to the second power supply terminal VGH, and a second electrode of the seventh transistor T7 is connected to the first output terminal OUT1.

A first terminal of the third capacitor C3 is connected to the second node P2, and a second terminal of the third capacitor C3 is connected to the first electrode of the sixth transistor T6.

A first terminal of the fourth capacitor C4 is connected to the fourth node P4, and a second terminal of the fourth capacitor C4 is connected to the first electrode of the seventh transistor T7.

As can be seen from FIG. 7 and FIG. 8, the second output sub-circuit 042 includes an eighth transistor T8 and a ninth transistor T9.

A gate of the eighth transistor T8 is connected to the second node P2, a first electrode of the eighth transistor T8 is connected to the second power supply terminal VGH, and a second electrode of the eighth transistor T8 is connected to the second output terminal OUT2.

A gate of the ninth transistor T9 is connected to the fourth node P4, a first electrode of the ninth transistor T9 is connected to the first power supply terminal VGL, and a second electrode of the ninth transistor T9 is connected to the second output terminal OUT2.

As can be seen from FIG. 7, for the structures shown in FIG. 1 to FIG. 5, on the premise that the second input circuit 02 is not connected to the first control terminal GCB, the first input circuit 01 described in the embodiments of the present disclosure includes a tenth transistor T10, and the second input circuit 02 includes an eleventh transistor T11.

A gate of the tenth transistor T10 is connected to the first control terminal GCB, a first electrode of the tenth transistor T10 is connected to the turn-on signal terminal STV, and a second electrode of the tenth transistor T10 is connected to the first node P1 and the second node P2.

A gate of the eleventh transistor T11 is connected to the first node P1, a first electrode of the eleventh transistor T11 is connected to the first power supply terminal VGL, and a second electrode of the eleventh transistor T11 is connected to the third node P3.

As can be seen from FIG. 8, for the structure shown in FIG. 6, on the premise that the first input circuit 01 is further connected to the first power supply terminal VGL and the second input circuit 02 is further connected to the first control terminal GCB, the first input circuit 01 described in the embodiments of the present disclosure includes a tenth transistor T10 and a twelfth transistor T12; and the second input circuit 02 includes an eleventh transistor T11 and a thirteenth transistor T13. That is, compared to the structure shown in FIG. 7, the twelfth transistor T12 and the thirteenth transistor T13 are added.

The gate of the tenth transistor T10 is connected to the first control terminal GCB, the first electrode of the tenth transistor T10 is connected to the turn-on signal terminal STV, and the second electrode of the tenth transistor T10 is connected to the first node P1.

A gate of the twelfth transistor T12 is connected to the first power supply terminal VGL, a first electrode of the twelfth transistor T12 is connected to the first node P1, and a second electrode of the twelfth transistor T12 is connected to the second node P2.

The gate of the eleventh transistor T11 is connected to the first node P1, the first electrode of the eleventh transistor T11 is connected to the first control terminal GCB, and the second electrode of the eleventh transistor T11 is connected to the third node P3.

A gate of the thirteenth transistor T13 is connected to the first control terminal GCB, a first electrode of the thirteenth transistor T13 is connected to the first power supply terminal VGL, and a second electrode of the thirteenth transistor T13 is connected to the third node P3.

As can be seen by comparing FIG. 7 and FIG. 8, under the premise that the first input circuit 01 is not connected to the first power supply terminal VGL, the first node P1 and the second node P2 are actually one node. On the premise that the first input circuit 01 is further connected to the first power supply terminal VGL, the first node P1 and the second node P2 are regarded as two nodes, the potential at the first node P1 is controlled by the tenth transistor T10, and the potential at the second node P2 is controlled by the tenth transistor T10 and the twelfth transistor T12.

Figure 9:
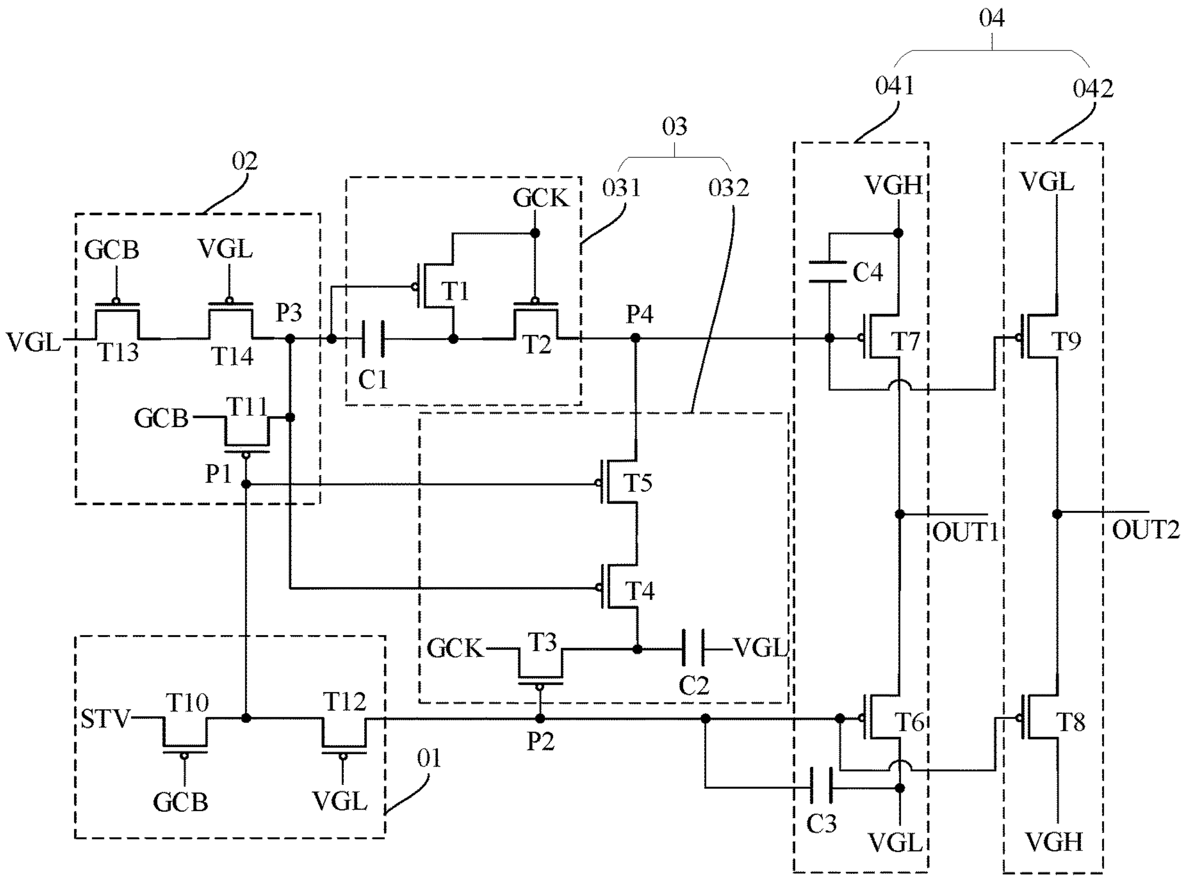
FIG. 9 is a circuit structure diagram of yet another shift register unit according to some embodiments of the present disclosure.

In some embodiments, for the structures shown in FIG. 7 and FIG. 8, similar to the first input circuit 01, the second input circuit 02 also includes a transistor having a gate connected to the first power supply terminal VGL (e.g., the fourteenth transistor T14 shown in FIG. 9).

On the basis of FIG. 7, it can be seen from FIG. 9 that the first electrode of the fourteenth transistor T14 is connected to the second electrode of the eleventh transistor T11, and the second electrode of the fourteenth transistor T14 is connected to the third node P3. On the basis of FIG. 8, it can be seen from FIG. 9 that the first electrode of the fourteenth transistor T14 is connected to the second electrode of the thirteenth transistor T13, and the second electrode of the fourteenth transistor T14 is connected to the third node P3. Since the first power supply terminal VGL continuously provides the first power supply signal at the first potential, for the structure shown in FIG. 7, the eleventh transistor T11 is in a stress state in one direction for a long time, and the eleventh transistor T11 is prone to electric leakage. Therefore, by providing the fourteenth transistor T14, the potential at the third node P3 can be prevented from being affected by electric leakage of the eleventh transistor T11.

In the embodiments of the present disclosure, all transistors in the shift register unit are P-type transistors. Correspondingly, as described in the foregoing embodiments, the first potential (i.e., the effective potential) is a low potential, and the second potential (i.e., the ineffective potential) is a high potential. Certainly, in some other embodiments, all transistors in the shift register unit are N-type transistors or P-type transistors, or a combination thereof. Correspondingly, the first potential (i.e., the effective potential) is a high potential, and the second potential (i.e., the ineffective potential) is a low potential.

For example, with reference to FIG. 7 to FIG. 9, the second output sub-circuit 042 includes an eighth transistor T8 and a ninth transistor T9.

A gate of the eighth transistor T8 is connected to the second node P2, a first electrode of the eighth transistor T8 is connected to the second power supply terminal VGH, and a second electrode of the eighth transistor T8 is connected to the second output terminal OUT2.

A gate of the ninth transistor T9 is connected to the fourth node P4, a first electrode of the ninth transistor T9 is connected to the first power supply terminal VGL, and a second electrode of the ninth transistor T9 is connected to the second output terminal OUT2. In addition, one of the ninth transistor T9 and the eighth transistor T8 is an N-type transistor, and the other one is a P-type transistor. The first output sub-circuit 041 is similar to the second output sub-circuit 042, and details are not described again.

In summary, the embodiments of the present disclosure provide a shift register unit. In the shift register unit, the first input circuit controls the potential at the first node and the potential at the second node in response to the first control signal provided by the first control terminal and the turn-on signal provided by the turn-on signal terminal. The second input circuit controls the potential at the third node in response to the potential at the first node and the first power supply signal provided by the first power supply terminal. The output control circuit controls the potential at the fourth node in response to the potential at the first node, the potential at the second node, the potential at the third node, and the second control signal provided by the second control terminal. The output circuit controls, in response to the potential at the second node and the potential at the fourth node, the first power supply terminal and the second power supply terminal to transmit the first power supply signal and the second power supply signal to the first output terminal and the second output terminal respectively at least within one same time period. In this way, the potential at the second node and the potential at the fourth node can be adjusted by flexibly setting the first control signal, the second control signal and the turn-on signal, such that the output circuit can simultaneously transmit the first power supply signal and the second power supply signal at different potentials to the first output terminal and the second output terminal respectively, that is, the shift register unit can simultaneously transmit the gate driving signals at different potentials to one pixel, so as to meet the requirement that one pixel emits light in response to a plurality of gate driving signals at different potentials. Therefore, compared with the related art, the number of the gate drive circuits required to be arranged is reduced, which is conducive to the narrow border design of the display device.

FIG. 10 shows a method for driving a shift register unit according to some embodiments of the present disclosure. This method is applicable for driving the shift register unit as shown in the above drawings. As shown in FIG. 10, the method includes the following steps.

In step 1001, in an input phase, a potential of a turn-on signal provided by a turn-on signal terminal and a potential of a first control signal provided by a first control terminal are both a first potential, a potential of a second control signal provided by a second control terminal is a second potential, a first input circuit controls a potential at a first node and a potential at a second node to be the first potential in response to the first control signal and the turn-on signal, a second input circuit controls a potential at a third node to be the first potential in response to the potential at the first node and a first power supply signal at the first potential provided by a first power supply terminal, an output control circuit controls a potential at a fourth node to be the second potential in response to the potential at the first node, the potential at the second node, the potential at the third node, and the second control signal, and an output circuit controls, in response to the potential at the second node and the potential at the fourth node, the first power supply terminal and a second power supply terminal to transmit the first power supply signal and a second power supply signal at the second potential to the first output terminal and the second output terminal respectively.

In step 1002, in an output phase, the potential of the second control signal is the first potential, the potential of the turn-on signal, the potential of the second power supply signal and the potential of the first control signal are all the second potential, the first input circuit controls the potential at the first node and the potential at the second node to be the second potential in response to the first control signal and the turn-on signal, the second input circuit controls the potential at the third node to be the first potential in response to the potential at the first node and the first power supply signal, the output control circuit controls the potential at the fourth node to be the first potential in response to the potential at the first node, the potential at the second node, the potential at the third node and the second control signal, and the output circuit controls, in response to the potential at the second node and the potential at the fourth node, the second power supply terminal and the first power supply terminal to transmit the first power supply signal and the second power supply signal to the first output terminal and the second output terminal respectively.

Figure 11:
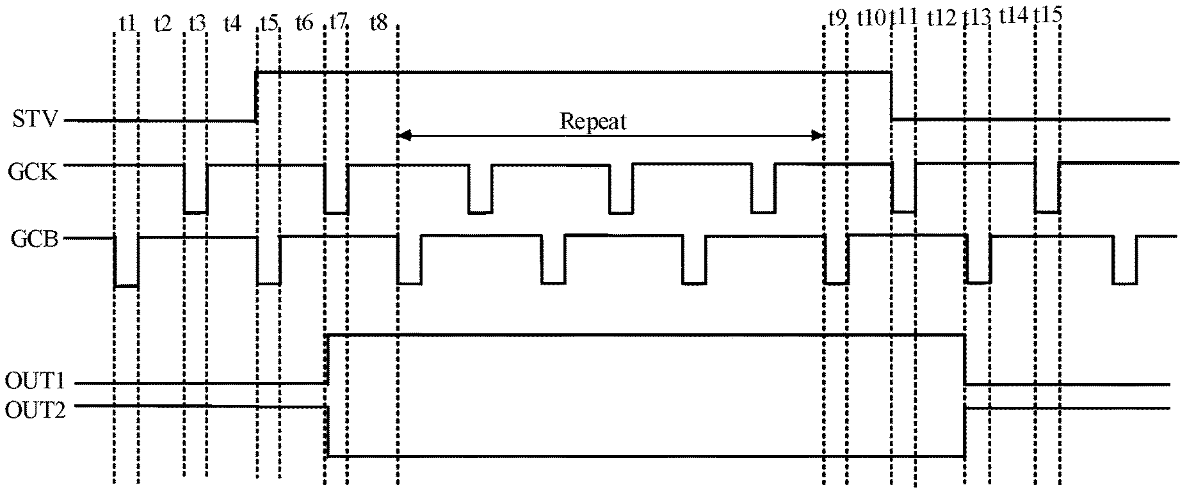
FIG. 11 is a sequence diagram of signal terminals connected to a shift register unit according to some embodiments of the present disclosure.

The driving principle of the shift register unit according to the embodiments of the present disclosure is described in detail by taking the shift register unit shown in FIG. 8 as an example in which all transistors in the shift register unit are P-type transistors, and the effective potential is a low potential relative to the ineffective potential. FIG. 11 shows a sequence diagram of various signal terminals in a shift register unit. It can be seen from FIG. 11 that the operating process of the shift register unit is divided into 15 phases: t1 to t15. From phase t1 to phase t15, the potential of the first power supply signal is continuously low, and the potential of the second power supply signal is continuously high. Thus, the twelfth transistor T12 remains turned on.

Referring to FIG. 11, in the phase t1, the potential of the turn-on signal provided by the turn-on signal terminal STV and the potential of the first control signal provided by the first control terminal GCB are both the low potential, and the potential of the second control signal provided by the second control terminal GCK is a high potential. Correspondingly, the tenth transistor T10 and the thirteenth transistor T13 are turned on, and the second transistor T2 is turned off. The turn-on signal at the low potential is transmitted to the first node P1 through the tenth transistor T10, and is then transmitted to the second node P2 through the twelfth transistor T12. The first power supply signal at the low potential is transmitted to the third node P3 through the thirteenth transistor T13. That is, in the phase t1, the potential at the first node P1, the potential at the second node P2 and the potential at the third node P3 are all the low potential. Correspondingly, the first transistor T1, the third transistor T3, the fourth transistor T4, the fifth transistor T5, the sixth transistor T6, the eighth transistor T8 and the eleventh transistor T11 are all turned on. The first control signal at the low potential is transmitted to the third node P3 through the eleventh transistor T11 to ensure that the potential at the third node P3 maintains at the first potential. The second control signal at the high potential is transmitted to the first electrode of the second transistor T2 through the first transistor T1, and is transmitted to the fourth node P4 through the third transistor T3, the fourth transistor T4 and the fifth transistor T5. That is, in the phase t1, the potential at the fourth node P4 is a high potential. Correspondingly, the seventh transistor T7 and the ninth transistor T9 are turned off. Thus, the first power supply signal at the low potential is transmitted to the first output terminal OUT1 through the sixth transistor T6, and the second power supply signal at the high potential is transmitted to the second output terminal OUT2 through the eighth transistor T8. That is, in the phase t1, the potential at the first output terminal OUT1 is the low potential, and the potential at the second output terminal OUT2 is the high potential.

In the phase t2, compared with the previous phase, the potential of the turn-on signal maintains at the low potential, the potential of the first control signal jumps to the high potential, and the potential of the second control signal maintains at the high potential. Correspondingly, the tenth transistor T10, the thirteenth transistor T13 and the second transistor T2 are all turned off. Because of the existence of the third capacitor C3, the potential at the first node P1 and the potential at the second node P2 both maintain at the low potential as in the phase t1. Correspondingly, the third transistor T3, the fifth transistor T5, the sixth transistor T6, the eighth transistor T8, and the eleventh transistor T11 all remain turned on. The first control signal at the high potential is transmitted to the third node P3 through the eleventh transistor T11. That is, in the phase t2, the potential at the third node P3 jumps to the high potential, and both the first transistor T1 and the fourth transistor T4 are turned off. Because of the existence of the fourth capacitor C4, the potential at the fourth node P4 maintains at the high potential as in the phase t1. Correspondingly, both the seventh transistor T7 and the ninth transistor T9 are turned off. In this way, the first power supply signal at the low potential continues being transmitted to the first output terminal OUT1 through the sixth transistor T6, and the second power supply signal at the high potential is transmitted to the second output terminal OUT2 through the eighth transistor T8. That is, in the phase t2, the potential at the first output terminal OUT1 is the low potential, and the potential at the second output terminal OUT2 is the high potential.

In the phase t3, compared with the previous phase, the potential of the turn-on signal maintains at the low potential, the potential of the first control signal maintains at the high potential, and the potential of the second control signal jumps to the low potential. Correspondingly, both the tenth transistor T10 and the third transistor T13 are turned off, and the second transistor T2 is turned on. Because of the existence of the third capacitor C3, both the potential at the first node P1 and the potential at the second node P2 maintain at the low potential as in the phase t2. Correspondingly, the third transistor T3, the fifth transistor T5, the sixth transistor T6, the eighth transistor T8 and the eleventh transistor T11 all remain turned on. The first control signal at the high potential continues being transmitted to the third node P3 through the eleventh transistor T11. That is, in the phase t3, the potential at the third node P3 maintains at the high potential. Correspondingly, the first transistor T1 and the fourth transistor T4 are turned off. The high potential at the third node P3 is transmitted to the fourth node P4 through the turned-on second transistor T2, such that the potential at the fourth node P4 maintains at the high potential as in the phase t2. Correspondingly, both the seventh transistor T7 and the ninth transistor T9 are turned off. In this way, the first power supply signal at the low potential continues being transmitted to the first output terminal OUT1 through the sixth transistor T6, and the second power supply signal at the high potential is transmitted to the second output terminal OUT2 through the eighth transistor T8. That is, in the phase t3, the potential at the first output terminal OUT1 is the low potential, and the potential at the second output terminal OUT2 is the high potential.

In the phase t4, compared with the previous phase, the potential of the turn-on signal maintains at the low potential, the potential of the first control signal maintains at the high potential, and the potential of the second control signal jumps to the high potential. Because the potentials in the phase t4 are the same as the potentials in the phase t2, please refer to the descriptions in the phase t2 for the turn-on or turned-off state of each transistor in the phase t4, and correspondingly, please refer to the potential at each node in the phase t2 for the potential at each node in the phase t4, and details are not repeated herein.

In the phase t5, compared with the previous phase, the potential of the turn-on signal jumps to the high potential, the potential of the first control signal jumps to the low potential, and the potential of the second control signal maintains at the high potential. Correspondingly, both the tenth transistor T10 and the thirteenth transistor T13 are turned on, and the second transistor T2 is turned off. The turn-on signal at the high potential is transmitted to the first node P1 through the tenth transistor T10, and is then transmitted to the second node P2 through the twelfth transistor T12. The first power supply signal at the low potential is transmitted to the third node P3 through the thirteenth transistor T13. That is, in the phase t5, the potential at the first node P1 and the potential at the second node P2 are both the high potential, and the potential at the third node P3 is the low potential. Correspondingly, the first transistor T1 and the fourth transistor T4 are turned on, and the third transistor T3, the fifth transistor T5, the sixth transistor T6, the eighth transistor T8 and the eleventh transistor T11 are all turned off. The second control signal at the high potential is transmitted to the first electrode of the second transistor T2 through the first transistor T1. Because of the existence of the fourth capacitor C4, the potential at the fourth node P4 maintains at the high potential as in the phase t4. Correspondingly, both the seventh transistor T7 and the ninth transistor T9 are turned off. In this way, the first output terminal OUT1 and the second output terminal OUT2 maintain at the potential as in the previous phase t4, that is, in the phase t5, the potential at the first output terminal OUT1 is the low potential, and the potential at the second output terminal OUT2 is the high potential.

In the phase t6, compared with the previous phase, the potential of the turn-on signal maintains at the high potential, the potential of the first control signal jumps to the high potential, and the potential of the second control signal maintains at the high potential. Correspondingly, the tenth transistor T10, the thirteenth transistor T13 and the second transistor T2 are all turned off. Because of the existence of the third capacitor C3, the potential at the first node P1 and the potential at the second node P2 both maintain at the high potential as in the phase t5, and because of the existence of the first capacitor C1, the potential at the third node P3 maintains at the low potential as in the phase t5. Correspondingly, the first transistor T1 and the fourth transistor T4 are turned on, and the third transistor T3, the fifth transistor T5, the sixth transistor T6, the eighth transistor T8 and the eleventh transistor T5 are all turned off. Because of the existence of the fourth capacitor C4, the potential at the fourth node P4 maintains at the high potential as in the phase t5. Correspondingly, both the seventh transistor T7 and the ninth transistor T9 are turned off. In this way, the first output terminal OUT1 and the second output terminal OUT2 maintain as the potential as in the previous phase t5, that is, in the phase t6, the potential at the first output terminal OUT1 is the low potential, and the potential at the second output terminal OUT2 is the high potential.

In the phase t7, compared with the previous phase, the potential of the turn-on signal maintains at the high potential, the potential of the first control signal maintains at the high potential, and the potential of the second control signal jumps to the low potential. Correspondingly, both the tenth transistor T10 and the thirteenth transistor T13 are turned off, and the second transistor T2 is turned on. Because of the existence of the third capacitor C3, the potential at the first node P1 and the potential at the second node P2 maintain at the high potential as in the phase t6, and because of the existence of the first capacitor C1, the potential at the third node P3 maintains at the low potential as in the phase t6. Correspondingly, the first transistor T1 and the fourth transistor T4 are turned on, and the third transistor T3, the fifth transistor T5, the sixth transistor T6, the eighth transistor T8 and the eleventh transistor T11 are all turned off. The second control signal at the low potential is transmitted to the fourth node P4 through the first transistor T1 and the second transistor T2. That is, in the phase t7, the potential at the fourth node P4 jumps to the low potential. Correspondingly, both the seventh transistor T7 and the ninth transistor T9 are turned on. In this way, the second power supply signal at the high potential is transmitted to the first output terminal OUT1 through the seventh transistor T7, and the first power supply signal at the low potential is transmitted to the second output terminal OUT2 through the ninth transistor T9. That is, in the phase t7, the potential at the first output terminal OUT1 jumps to the high potential, and the potential at the second output terminal OUT2 jumps to the low potential.

In the phase t8, compared with the previous phase, the potential of the turn-on signal maintains at the high potential, the potential of the first control signal maintains at the high potential, and the potential of the second control signal jumps to the high potential. Correspondingly, the second transistor T2, the tenth transistor T10 and the thirteenth transistor T13 are all turned off. Because of the existence of the third capacitor C3, the potential at the first node P1 and the potential at the second node P2 maintain at the high potential as in the phase t7; because of the existence of the first capacitor C1, the potential at the third node P3 maintains at the low potential as in the phase t7; and because of the existence of the fourth capacitor C4, the potential at the fourth node P4 maintains at the low potential as in the phase t7. Correspondingly, the first transistor T1, the fourth transistor T4, the seventh transistor T7 and the ninth transistor T9 are all turned on; and the third transistor T3, the fifth transistor T5, the sixth transistor T6, the eighth transistor T8 and the eleventh transistor T11 are all turned off. The second control signal at the low potential is transmitted to the fourth node P4 through the first transistor T1 and the second transistor T2. In this way, the second power supply signal at the high potential continues being transmitted to the first output terminal OUT1 through the seventh transistor T7, and the first power supply signal at the low potential continues being transmitted to the second output terminal OUT2 through the ninth transistor T9. That is, in the phase t8, the potential at the first output terminal OUT1 maintains at the high potential as in the phase t7, and the potential at the second output terminal OUT2 maintains at the low potential as in the phase t7.

From the phase t8 to the phase t9, the phase t7 and the phase t8 are repeated multiple times. In the phase t9, the potential of the turn-on signal is the high potential, the potential of the first control signal is the low potential, and the potential of the second control signal is the high potential. Correspondingly, the tenth transistor T10 and the thirteenth transistor T13 are turned on, and the second transistor T2 is turned off. The turn-on signal at the high potential is transmitted to the first node P1 through the tenth transistor T10, and is then transmitted to the second node P2 through the twelfth transistor T12. The first power supply signal at the low potential is transmitted to the third node P3 through the thirteenth transistor T13. That is, in the phase t9, the potential at the first node P1 and the potential at the second node P2 are both the high potential, and the potential at the third node P3 is the low potential. Correspondingly, the first transistor T1 and the fourth transistor T4 are turned on, and the third transistor T3, the fifth transistor T5, the sixth transistor T6, the eighth transistor T8 and the eleventh transistor T11 are all turned off. The second control signal at the high potential is transmitted to the first electrode of the second transistor T2 through the first transistor T1. Because of the existence of the fourth capacitor C4, the potential at the fourth node P4 maintains at the low potential as in the phase t8. Correspondingly, both the seventh transistor T7 and the ninth transistor T9 are turned on. In this way, the second power supply signal at the high potential continues being transmitted to the first output terminal OUT1 through the seventh transistor T7, and the first power supply signal at the low potential continues being transmitted to the second output terminal OUT2 through the ninth transistor T9. That is, in the phase t9, the potential at the first output terminal OUT1 maintains at the high potential as in the phase t7, and the potential at the second output terminal OUT2 maintains at the low potential as in the phase t7.

In the phase t10, compared with the previous phase, the potential of the turn-on signal maintains at the high potential, the potential of the first control signal jumps to the high potential, and the potential of the second control signal maintains at the high potential. Correspondingly, the second transistor T2, the tenth transistor T10 and the thirteenth transistor T13 are all turned off. Because of the existence of the third capacitor C3, the potential at the first node P1 and the potential at the second node P2 maintain at the high potential as in the phase t9; because of the existence of the first capacitor C1, the potential at the third node P3 maintains at the low potential as in the phase t9; and because of the existence of the fourth capacitor C4, the potential at the fourth node P4 maintains at the low potential as in the phase t9. Correspondingly, the first transistor T1, the fourth transistor T4, the seventh transistor T7 and the ninth transistor T9 are all turned on; and the third transistor T3, the fifth transistor T5, the sixth transistor T6, the eighth transistor T8 and the eleventh transistor T11 are all turned off. The second control signal at the high potential is transmitted to the first electrode of the second transistor T2 through the first transistor T1. In this way, the second power supply signal at the high potential continues being transmitted to the first output terminal OUT1 through the seventh transistor T7, and the first power supply signal at the low potential continues being transmitted to the second output terminal OUT2 through the ninth transistor T9. That is, in the phase t10, the potential at the first output terminal OUT1 maintains at the high potential as in the phase t9, and the potential at the second output terminal OUT2 maintains at the low potential as in the phase t9.

In the phase t11, compared with the previous phase, the potential of the turn-on signal jumps to the low potential, the potential of the first control signal maintains at the high potential, and the potential of the second control signal jumps to the low potential. Correspondingly, the tenth transistor T10 and the thirteenth transistor T13 are turned off, and the second transistor T2 is turned on. Because of the existence of the third capacitor C3, the potential at the first node P1 and the potential at the second node P2 maintain at the high potential as in the phase t10, and because of the existence of the first capacitor C1, the potential at the third node P3 maintains at the low potential as in the phase t10. Correspondingly, the first transistor T1 and the fourth transistor T4 are turned on, and the third transistor T3, the fifth transistor T5, the sixth transistor T6, the eighth transistor T8 and the eleventh transistor T11 are all turned off. The second control signal at the low potential is transmitted to the fourth node P4 through the first transistor T1 and the second transistor T2. That is, in the phase t11, the potential at the fourth node P4 continues maintaining at the low potential. Correspondingly, both the seventh transistor T7 and the ninth transistor T9 are turned on. In this way, the second power supply signal at the high potential continues being transmitted to the first output terminal OUT1 through the seventh transistor T7, and the first power supply signal at the low potential continues being transmitted to the second output terminal OUT2 through the ninth transistor T9. That is, in the phase t11, the potential at the first output terminal OUT1 maintains at the high potential as in the phase t10, and the potential at the second output terminal OUT2 maintains at the low potential as in the phase t10.

In the phase t12, compared with the previous phase, the potential of the turn-on signal maintains at the low potential, the potential of the first control signal maintains at the high potential, and the potential of the second control signal jumps to the high potential. Correspondingly, the second transistor T2, the tenth transistor T10 and the thirteenth transistor T13 are all turned off. Because of the existence of the third capacitor C3, the potential at the first node P1 and the potential at the second node P2 maintain at the high potential as in the phase t11; because of the existence of the first capacitor C1, the potential at the third node P3 maintains at the low potential as in the phase t11; and because of the existence of the fourth capacitor C4, the potential at the fourth node P4 maintains at the low potential as in the phase t11. Correspondingly, the first transistor T1, the fourth transistor T4, the seventh transistor T7 and the ninth transistor T9 are all turned on, and the third transistor T3, the fifth transistor T5, the sixth transistor T6, the eighth transistor T8 and the eleventh transistor T11 are all turned off. Thus, the second power supply signal at the high potential continues being transmitted to the first output terminal OUT1 through the seventh transistor T7, and the first power supply signal at the low potential continues being transmitted to the second output terminal OUT2 through the ninth transistor T9. That is, in the phase t12, the potential at the first output terminal OUT1 maintains at the high potential as in the phase t11, and the potential at the second output terminal OUT2 maintains at the low potential as in the phase t11.

In the phase t13, compared with the previous phase, the potential of the turn-on signal maintains at the low potential, the potential of the first control signal jumps to the low potential, and the potential of the second control signal maintains at the high potential. Correspondingly, the tenth transistor T10 and the thirteenth transistor T13 are turned on, and the second transistor T2 is turned off. The turn-on signal at the low potential is transmitted to the first node P1 through the tenth transistor T10, and is then transmitted to the second node P2 through the twelfth transistor T12. The first power supply signal at the low potential is transmitted to the third node P3 through the thirteenth transistor T13. That is, in the phase t13, the potential at the first node P1, the potential at the second node P2 and the potential at the third node P3 are all the low potential. Correspondingly, the first transistor T1, the third transistor T3, the fourth transistor T4, the fifth transistor T5, the sixth transistor T6, the eighth transistor T8 and the eleventh transistor T11 are all turned on. The first control signal at the low potential is transmitted to the third node P3 through the eleventh transistor T11. The second control signal at the high potential is transmitted to the first electrode of the second transistor T2 through the first transistor T1, and is transmitted to the fourth node P4 through the third transistor T3, the fourth transistor T4 and the fifth transistor T5. That is, in the phase t13, the potential at the fourth node P4 jumps to the high potential. Correspondingly, the seventh transistor T7 and the ninth transistor T9 are turned off. In this way, the first power supply signal at the low potential is transmitted to the first output terminal OUT1 through the sixth transistor T6, and the second power supply signal at the high potential is transmitted to the second output terminal OUT2 through the eighth transistor T8. That is, in the phase t13, the potential at the first output terminal OUT1 is the low potential, and the potential at the second output terminal OUT2 is the high potential.

In the phase t14, compared with the previous phase, the potential of the turn-on signal maintains at the low potential, the potential of the first control signal jumps to the high potential, and the potential of the second control signal maintains at the high potential. Because the potentials in the phase t14 are the same as the potentials in the phase t2 after the phase t1, please refer to the descriptions in the phase t2 for the turned-on or turned-off state of each transistor in the phase t14, and correspondingly, please refer to the potential at each node in the phase t2 for the potential at each node in the phase t14, and details are not repeated herein.

In the phase t15, compared with the previous phase, the potential of the turn-on signal maintains at the low potential, the potential of the first control signal maintains at the high potential, and the potential of the second control signal jumps to the low potential. Because the potentials in the phase t15 are the same as the potentials in the phase t3 after the phase t2, please refer to the descriptions in the phase t3 for the turned-on or turned-off state of each transistor in the phase t15, and correspondingly, please refer to the potential at each node in the phase t3 for the potential at each node in the phase t15, and details are not repeated herein.

According to the foregoing embodiments, it can be known that the phase t1 to the phase t6 are considered as an input phase, the phase t7 to the phase t10 are considered as an output phase, and the phase t11 to the phase t15 are considered as an input phase of a next frame. For example, FIG. 12 further shows a waveform simulation diagram in the case that C2 is or is not provided, where the abscissa represents time in microsecond (μs), and the ordinate represents voltage in volt (V).

In conjunction with the foregoing embodiments, Table 1 shows the potential at each node in the phase t1 to the phase t15, where "L" represents the low potential, and "H" represents the high potential.

TABLE 1

| Voltage | t1 | t2 | t3 | t4 | t5 | t6 | t7 | t8 | t9 | t10 | t11 | t12 | t13 | t14 | t15 |
|---|---|---|---|---|---|---|---|---|---|---|---|---|---|---|---|
| P1 | L | L | L | L | H | H | H | H | H | H | H | H | L | L | L |
| P2 | L | L | L | L | H | H | H | H | H | H | H | H | L | L | L |
| P3 | L | H | H | H | L | L | L | L | L | L | L | L | L | L | H |
| P4 | H | H | H | H | H | H | L | L | L | L | L | L | H | H | H |
| OUT1 | L | L | L | L | L | L | H | H | H | H | H | H | L | L | L |
| OUT2 | H | H | H | H | H | H | L | L | L | L | L | L | H | H | H |

Figure 12:
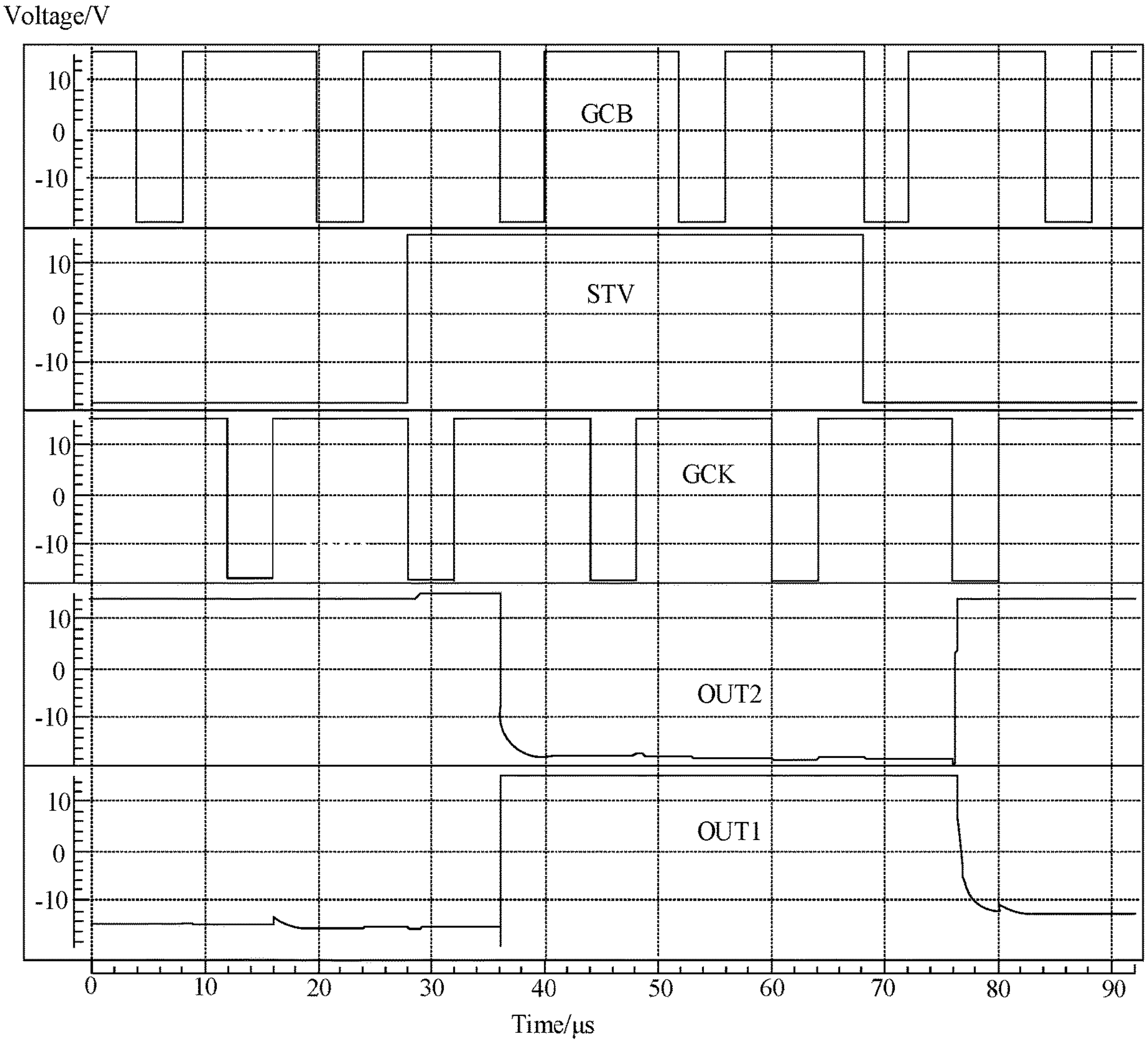
FIG. 12 is a sequence simulation diagram of signal terminals according to some embodiments of the present disclosure.

In conjunction with the above Table 1, FIG. 11 and FIG. 12, it can be seen that in the output phase from t7 to t10, and in the phase t11 and phase t12, the first output terminal OUT1 outputs the second power supply signal at the high potential, and the second output terminal OUT2 outputs the first power supply signal at the low potential. In addition, in other phases except the output phase and the phase t11 and phase t12, the first output terminal OUT1 outputs the first power supply signal at the low potential, and the second output terminal OUT2 outputs the second power supply signal at the high potential. Based on this, as described in the foregoing embodiments, the first output terminal OUT1 of the shift register unit is set to be connected to the N-type transistor in the pixel circuit, and the second output terminal OUT2 of the shift register unit is set to be connected to the P-type transistor in the pixel circuit, thereby reliably driving the pixel circuit to operate.

In summary, the embodiments of the present disclosure provide a method for driving a shift register unit. In the method, the first input circuit controls the potential at the first node and the potential at the second node in response to the first control signal provided by the first control terminal and the turn-on signal provided by the turn-on signal terminal. The second input circuit controls the potential at the third node in response to the potential at the first node and the first power supply signal provided by the first power supply terminal. The output control circuit controls the potential at the fourth node in response to the potential at the first node, the potential at the second node, the potential at the third node, and the second control signal provided by the second control terminal. The output circuit controls, in response to the potential at the second node and the potential at the fourth node, the first power supply terminal and the second power supply terminal to transmit the first power supply signal and the second power supply signal to the first output terminal and the second output terminal respectively at least within one same time period. In this way, the potential at the second node and the potential at the fourth node can be adjusted by flexibly setting the first control signal, the second control signal and the turn-on signal, such that the output circuit can simultaneously transmit the first power supply signal and the second power supply signal at different potentials to the first output terminal and the second output terminal respectively, that is, the shift register unit can simultaneously transmit the gate driving signals at different potentials to one pixel, so as to meet the requirement that one pixel emits light in response to a plurality of gate driving signals at different potentials. Therefore, compared with the related art, the number of the gate drive circuits required to be arranged is reduced, which is conducive to the narrow border design of the display device.

Figure 13:
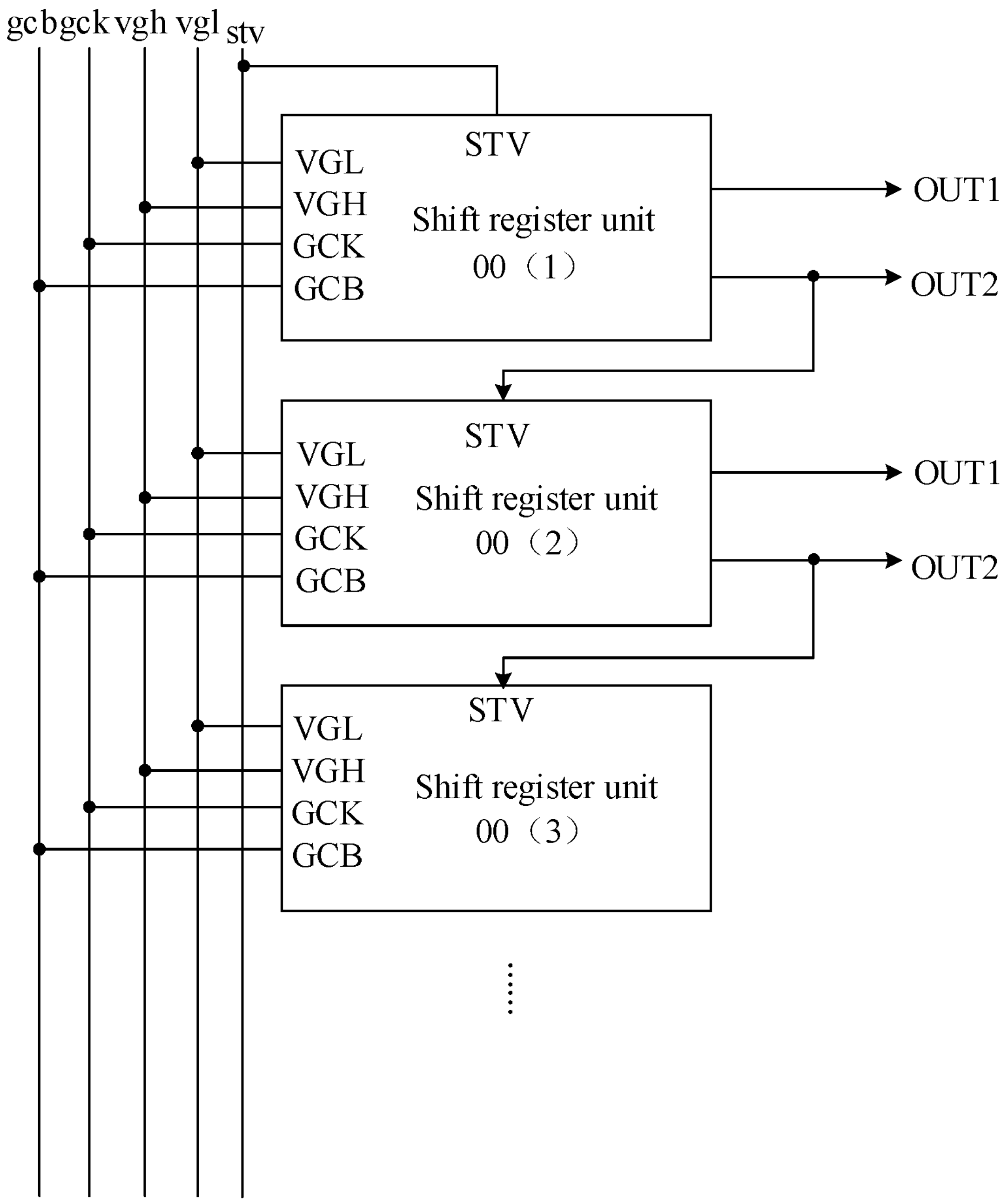
FIG. 13 is a schematic structural diagram of a gate drive circuit according to some embodiments of the present disclosure.

FIG. 13 is a schematic structural diagram of a gate drive circuit according to some embodiments of the present disclosure. As shown in FIG. 13, the gate drive circuit includes at least two (i.e., a plurality of) cascaded shift register units 00 as shown in the above embodiments.

As can be seen from the above figures and FIG. 13, the first power supply terminal VGL of each shift register unit 00 is connected to a first power line vgl, and the first power line vgl provides the first power supply signal described in the foregoing embodiments to the first power supply terminal VGL. The second power supply terminal VGH of each shift register unit 00 is connected to a second power line vgh, and the second power line vgh provides the second power supply signal described in the foregoing embodiments to the second power supply terminal VGH. The first control terminal GCB of each shift register unit 00 is connected to a first control line gcb, and the first control line gcb provides the first control signal described in the foregoing embodiments to the first control terminal GCB. The second control terminal GCK of each shift register unit 00 is connected to a second control line gck, and the second control line gck provides the second control signal described in the foregoing embodiments to the second control terminal GCK. The turn-on signal terminal STV of the first stage of shift register unit 00 is further connected to a turn-on signal line stv, and the turn-on signal line stv provides the turn-on signal described in the foregoing embodiments to the turn-on signal terminal STV. The turn-on signal terminal STV of each stage of shift register unit 00 except the first stage of shift register unit 00 is connected to the output terminal (e.g., the second output terminal OUT2) of the previous stage of cascaded shift register unit, to receive the turn-on signal.

Figure 14:
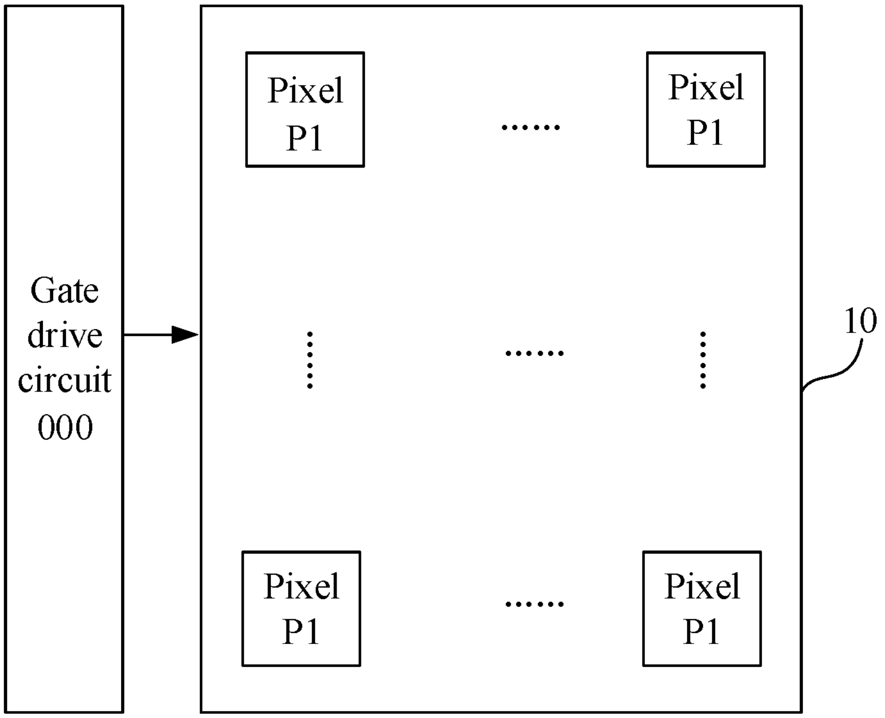
FIG. 14 is a schematic structural diagram of a display device according to some embodiments of the present disclosure.

FIG. 14 is a schematic structural diagram of a display device according to some embodiments of the present disclosure. As shown in FIG. 14, the display device includes a display panel 10, a plurality of pixels P1 disposed on the display panel 10, and the gate drive circuit 000 as shown in FIG. 13. Each pixel includes an N-type transistor and a P-type transistor. In conjunction with FIG. 1, the pixel circuit of each pixel includes an N-type transistor and a P-type transistor.

On this basis, with reference to FIG. 13, in the gate drive circuit 000, the first output terminal OUT1 of at least one of the shift register units 00 is connected to at least one of the N-type transistors in the plurality of pixels P1, and is configured to provide a gate driving signal to the at least one of the N-type transistors. In addition, the second output terminal OUT2 of at least one of the shift register units is connected to at least one of the P-type transistors in the plurality of pixels, and is configured to provide a gate driving signal to the at least one of the P-type transistors.

For example, in conjunction with FIG. 1, the first output terminals OUT1 of the plurality of shift register units 00 are connected to the N-type transistors M1 and M2 in the plurality of pixels P1 in one-to-one correspondence through one gate line (referred to as a first gate line), and the second output terminals OUT2 of the plurality of shift register units 00 are connected to the P-type transistors M5 in the plurality of pixels P1 in one-to-one correspondence through another gate line (referred to as a second gate line). On this basis, in order to avoid signal crosstalk between the first gate line and the second gate line, the first gate line and the second gate line are disposed in different layers. That is, the first gate line and the second gate line are made of different layers of metal. For example, the first gate line is made of a first gate metal layer Gate1 in the display panel 10, that is, the first gate line is disposed in the same layer as the first gate metal layer Gate1. The second gate line is made of a second gate metal layer Gate2 in the display panel 10, that is, the second gate line is disposed in the same layer as the second gate metal layer Gate2. The first gate metal layer Gate1 and the second gate metal layer Gate2 are generally sequentially laminated in a direction going away from the substrate in the display panel 10.

In the embodiments of the present disclosure, the material of the N-type transistor includes an oxide material, and the material of the P-type transistor includes a low temperature poly-silicon (LTPS) material. That is, the display panel is a low temperature polycrystalline oxide (LTPO) display panel. It should be noted that the material of the transistor generally refers to the material of the active layer included in the transistor.

In some embodiments, the display device in the embodiments of the present disclosure may be any product or component having a display function, such as electronic paper, an organic light emitting diode (OLED) panel, a mobile phone, a tablet computer, a television, a display, a notebook computer, a digital photo frame, and a navigator.

The terms in the section of the detailed description of the present disclosure are merely used for the purpose of explaining the embodiments of the present disclosure, and are not intended to limit the present disclosure. Unless otherwise defined, the technical terms or scientific terms used in the embodiments of the present disclosure shall be taken to mean the ordinary meanings as understood by those of ordinary skill in the art to which the present disclosure belongs.

The terms "first," "second," "third," and similar terms used in the description and claims of the present disclosure do not denote any order, quantity, or importance, but rather are merely used to distinguish different components.

Similarly, the singular forms "an," "a," and "the" are not intended to limit the number but include both singular and plural referents.

The term "include" or "comprise" and similar terms are intended to mean that the element or object before "include" or "comprise" covers the elements or objects or equivalents listed after "include" or "comprise," without excluding other elements or objects.

The terms "upper," "lower," "left," "right," and the like only indicate the relative positional relationship, and when the absolute position of a described object changes, the relative positional relationship may also change accordingly. The term "connected" or "coupled" refers to electric connection.

The term "and/or" represents that there may exist three types of relationships. For example, A and/or B represents three situations: A exists alone, A and B exist simultaneously, and B exists alone. The character "/" herein generally represents an "or" relationship between the associated objects before and after the character.

It should be clearly understood by persons skilled in the art that for ease and brevity of description, for the specific operating processes of the above-described gate drive circuit, shift register unit, various circuits and sub-circuits, reference may be made to the corresponding processes in the above-described method embodiments, and details are not repeated herein.

Described above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A shift register unit, comprising:

a first input circuit, connected to a first control terminal, a turn-on signal terminal, a first node and a second node, and configured to control a potential at the first node and a potential at the second node in response to a first control signal provided by the first control terminal and a turn-on signal provided by the turn-on signal terminal;

a second input circuit, connected to a first power supply terminal, the first node and a third node, and configured to control a potential at the third node in response to the potential at the first node and a first power supply signal provided by the first power supply terminal;

an output control circuit, connected to the first node, the second node, the third node, a second control terminal and a fourth node, and configured to control a potential at the fourth node in response to the potential at the first node, the potential at the second node, the potential at the third node and a second control signal provided by the second control terminal; and an output circuit, connected to the second node, the fourth node, the first power supply terminal, a second power supply terminal, a first output terminal and a second output terminal, and configured to control the first power supply terminal and the second power supply terminal to transmit the first power supply signal and a second power supply signal to the first output terminal and the second output terminal respectively at least within one same time period, in response to the potential at the second node and the potential at the fourth node.

2. The shift register unit according to claim 1, wherein the output control circuit comprises: a delay sub-circuit and an inverter sub-circuit; wherein the delay sub-circuit is connected to the third node, the second control terminal and the fourth node, and is configured to control conduction/non-conduction between the third node and the fourth node in response to the second control signal; and the inverter sub-circuit is connected to the first node, the second node, the third node, the fourth node and a third control terminal, and is configured to control conduction/non-conduction between the third control terminal and the fourth node in response to the potential at the first node, the potential at the second node and the potential at the third node.

3. The shift register unit according to claim 2, wherein the delay sub-circuit comprises a first transistor, a second transistor and a first capacitor; wherein a gate of the first transistor is connected to the third node, a first electrode of the first transistor is connected to the second control terminal, and a second electrode of the first transistor is connected to a first electrode of the second transistor;

a gate of the second transistor is connected to the second control terminal, and a second electrode of the second transistor is connected to the fourth node; and a first terminal of the first capacitor is connected to the third node, and a second terminal of the first capacitor is connected to the first electrode of the second transistor.

4. The shift register unit according to claim 2, wherein the inverter sub-circuit comprises: a third transistor, a fourth transistor and a fifth transistor; wherein a gate of the third transistor is connected to the second node, a first electrode of the third transistor is connected to the third control terminal, a second electrode of the third transistor is connected to a first electrode of the fourth transistor, and the third control terminal comprises the second control terminal or the second power supply terminal; and a gate of one of the fourth transistor and the fifth transistor is connected to the third node, a gate of the other one of the fourth transistor and the fifth transistor is connected to the first node, a second electrode of the fourth transistor is connected to a first electrode of the fifth transistor, and a second electrode of the fifth transistor is connected to the fourth node.

5. The shift register unit according to claim 2, wherein the inverter sub-circuit is further connected to the first power supply terminal and is configured to control the potential at the fourth node in response to the first power supply signal.

6. The shift register unit according to claim 5, wherein the inverter sub-circuit further comprises: a second capacitor; wherein a first terminal of the second capacitor is connected to the first power supply terminal, and a second terminal of the second capacitor is connected to the first electrode of the fourth transistor.

7. The shift register unit according to claim 1, wherein the output circuit comprises a first output sub-circuit and a second output sub-circuit; wherein the first output sub-circuit is connected to the second node, the fourth node, the first power supply terminal, the second power supply terminal and the first output terminal, and is configured to control conduction/non-conduction between the first power supply terminal and the first output terminal in response to the potential at the second node, and control conduction/non-conduction between the second power supply terminal and the first output terminal in response to the potential at the fourth node; and the second output sub-circuit is connected to the second node, the fourth node, the first power supply terminal, the second power supply terminal and the second output terminal, and is configured to control conduction/non-conduction between the second power supply terminal and the second output terminal in response to the potential at the second node, and control conduction/non-conduction between the first power supply terminal and the second output terminal in response to the potential at the fourth node.

8. The shift register unit according to claim 7, wherein the first output sub-circuit comprises a sixth transistor, a seventh transistor, a third capacitor and a fourth capacitor; wherein a gate of the sixth transistor is connected to the second node, a first electrode of the sixth transistor is connected to the first power supply terminal, and a second electrode of the sixth transistor is connected to the first output terminal;

a gate of the seventh transistor is connected to the fourth node, a first electrode of the seventh transistor is connected to the second power supply terminal, and a second electrode of the seventh transistor is connected to the first output terminal;

a first terminal of the third capacitor is connected to the second node, and a second terminal of the third capacitor is connected to the first electrode of the sixth transistor; and a first terminal of the fourth capacitor is connected to the fourth node, and a second terminal of the fourth capacitor is connected to the first electrode of the seventh transistor;

the second output sub-circuit comprises an eighth transistor and a ninth transistor; wherein a gate of the eighth transistor is connected to the second node, a first electrode of the eighth transistor is connected to the second power supply terminal, and a second electrode of the eighth transistor is connected to the second output terminal; and a gate of the ninth transistor is connected to the fourth node, a first electrode of the ninth transistor is connected to the first power supply terminal, and a second electrode of the ninth transistor is connected to the second output terminal.

9. The shift register unit according to claim 1, wherein the first input circuit comprises a tenth transistor; wherein a gate of the tenth transistor is connected to the first control terminal, a first electrode of the tenth transistor is connected to the turn-on signal terminal, and a second electrode of the tenth transistor is connected to the first node and the second node;

the second input circuit comprises an eleventh transistor; wherein a gate of the eleventh transistor is connected to the first node, a first electrode of the eleventh transistor is connected to the first power supply terminal, and a second electrode of the eleventh transistor is connected to the third node.

10. The shift register unit according to claim 1, wherein the first input circuit is further connected to the first power supply terminal, and is configured to control the potential at the first node and the potential at the second node in response to the first control signal, the turn-on signal and the first power supply signal; and the second input circuit is further connected to the first control terminal, and is configured to control the potential at the third node in response to the potential at the first node, the first power supply signal and the first control signal.

11. The shift register unit according to claim 10, wherein the first input circuit comprises a tenth transistor and a twelfth transistor; wherein a gate of the tenth transistor is connected to the first control terminal, a first electrode of the tenth transistor is connected to the turn-on signal terminal, and a second electrode of the tenth transistor is connected to the first node; and a gate of the twelfth transistor is connected to the first power supply terminal, a first electrode of the twelfth transistor is connected to the first node, and a second electrode of the twelfth transistor is connected to the second node;

the second input circuit comprises an eleventh transistor and a thirteenth transistor; wherein a gate of the eleventh transistor is connected to the first node, a first electrode of the eleventh transistor is connected to the first control terminal, and a second electrode of the eleventh transistor is connected to the third node; and a gate of the thirteenth transistor is connected to the first control terminal, a first electrode of the thirteenth transistor is connected to the first power supply terminal, and a second electrode of the thirteenth transistor is connected to the third node.

12. A method for driving a shift register unit, applicable for driving the shift register unit according to claim 1, the method comprising:

in an input phase during which a potential of a turn-on signal provided by a turn-on signal terminal and a potential of a first control signal provided by a first control terminal are a first potential, a potential of a second control signal provided by a second control terminal is a second potential, controlling, by a first input circuit, a potential at a first node and a potential at a second node to be the first potential in response to the first control signal and the turn-on signal; controlling, by a second output-input circuit, a potential at a third node to be the first potential in response to the potential at the first node and a first power supply signal provided by a first power supply terminal;

controlling, by an output control circuit, a potential at a fourth node to be the second potential in response to the potential at the first node, the potential at the second node, the potential at the third node and the second control signal; and controlling, by an output circuit, the first power supply terminal and a second power supply terminal to transmit the first power supply signal and a second power supply signal at the second potential to a first output terminal and a second output terminal respectively, in response to the potential at the second node and the potential at the fourth node; and in an output phase during which the potential of the second control signal is the first potential, the potential of the turn-on signal, the potential of the second power supply signal and the potential of the first control signal are all the second potential, controlling, by the first input circuit, the potential at the first node and the potential at the second node to be the second potential in response to the first control signal and the turn-on signal; controlling, by the second input circuit, the potential at the third node to be the first potential in response to the potential at the first node and the first power supply signal; controlling, by the output control circuit, the potential at the fourth node to be the first potential in response to the potential at the first node, the potential at the second node, the potential at the third node and the second control signal; and controlling, by the output circuit, the second power supply terminal and the first power supply terminal to transmit the first power supply signal and the second power supply signal to the first output terminal and the second output terminal respectively, in response to the potential at the second node and the potential at the fourth node.

13. A gate drive circuit, comprising: at least two cascaded shift register units, wherein the shift register unit comprises:

a first input circuit, connected to a first control terminal, a turn-on signal terminal, a first node and a second node, and configured to control a potential at the first node and a potential at the second node in response to a first control signal provided by the first control terminal and a turn-on signal provided by the turn-on signal terminal;

a second input circuit, connected to a first power supply terminal, the first node and a third node, and configured to control a potential at the third node in response to the potential at the first node and a first power supply signal provided by the first power supply terminal;

an output control circuit, connected to the first node, the second node, the third node, a second control terminal and a fourth node, and configured to control a potential at the fourth node in response to the potential at the first node, the potential at the second node, the potential at the third node and a second control signal provided by the second control terminal; and an output circuit, connected to the second node, the fourth node, the first power supply terminal, a second power supply terminal, a first output terminal and a second output terminal, and configured to control the first power supply terminal and the second power supply terminal to transmit the first power supply signal and a second power supply signal to the first output terminal and the second output terminal respectively at least within one same time period, in response to the potential at the second node and the potential at the fourth node.

14. A display device, comprising: a display panel, a plurality of pixels disposed on the display panel, and a gate drive circuit, wherein each of the plurality of pixels comprises an N-type transistor and a P-type transistor; and the gate drive circuit including: at least two cascaded shift register units, wherein the shift register unit comprises:

a first input circuit, connected to a first control terminal, a turn-on signal terminal, a first node and a second node, and configured to control a potential at the first node and a potential at the second node in response to a first control signal provided by the first control terminal and a turn-on signal provided by the turn-on signal terminal;

a second input circuit, connected to a first power supply terminal, the first node and a third node, and configured to control a potential at the third node in response to the potential at the first node and a first power supply signal provided by the first power supply terminal;

an output control circuit, connected to the first node, the second node, the third node, a second control terminal and a fourth node, and configured to control a potential at the fourth node in response to the potential at the first node, the potential at the second node, the potential at the third node and a second control signal provided by the second control terminal; and an output circuit, connected to the second node, the fourth node, the first power supply terminal, a second power supply terminal, a first output terminal and a second output terminal, and configured to control the first power supply terminal and the second power supply terminal to transmit the first power supply signal and a second power supply signal to the first output terminal and the second output terminal respectively at least within one same time period, in response to the potential at the second node and the potential at the fourth node; wherein in the gate drive circuit, the first output terminal of at least one shift register unit is connected to at least one N-type transistor in the plurality of pixels, and is configured to provide a gate driving signal to the at least one N-type transistor; and in the gate drive circuit, the second output terminal of the at least one shift register unit is connected to at least one P-type transistor in the plurality of pixels, and is configured to provide the gate driving signal to the at least one P-type transistor.

15. The display device according to claim 14, wherein a material of the N-type transistor comprises an oxide material, and a material of the P-type transistor comprises a low temperature poly-silicon material.

16. The gate drive circuit according to claim 13, wherein the output control circuit comprises: a delay sub-circuit and an inverter sub-circuit; wherein the delay sub-circuit is connected to the third node, the second control terminal and the fourth node, and is configured to control conduction/non-conduction between the third node and the fourth node in response to the second control signal; and the inverter sub-circuit is connected to the first node, the second node, the third node, the fourth node and a third control terminal, and is configured to control conduction/non-conduction between the third control terminal and the fourth node in response to the potential at the first node, the potential at the second node and the potential at the third node.

17. The gate drive circuit according to claim 16, wherein the delay sub-circuit comprises a first transistor, a second transistor and a first capacitor; wherein a gate of the first transistor is connected to the third node, a first electrode of the first transistor is connected to the second control terminal, and a second electrode of the first transistor is connected to a first electrode of the second transistor;

a gate of the second transistor is connected to the second control terminal, and a second electrode of the second transistor is connected to the fourth node; and a first terminal of the first capacitor is connected to the third node, and a second terminal of the first capacitor is connected to the first electrode of the second transistor.

18. The gate drive circuit according to claim 16, wherein the inverter sub-circuit comprises: a third transistor, a fourth transistor and a fifth transistor; wherein a gate of the third transistor is connected to the second node, a first electrode of the third transistor is connected to the third control terminal, a second electrode of the third transistor is connected to a first electrode of the fourth transistor, and the third control terminal comprises the second control terminal or the second power supply terminal; and a gate of one of the fourth transistor and the fifth transistor is connected to the third node, a gate of the other one of the fourth transistor and the fifth transistor is connected to the first node, a second electrode of the fourth transistor is connected to a first electrode of the fifth transistor, and a second electrode of the fifth transistor is connected to the fourth node.

19. The gate drive circuit according to claim 16, wherein the inverter sub-circuit is further connected to the first power supply terminal and is configured to control the potential at the fourth node in response to the first power supply signal.

20. The gate drive circuit according to claim 19, wherein the inverter sub-circuit further comprises: a second capacitor; wherein a first terminal of the second capacitor is connected to the first power supply terminal, and a second terminal of the second capacitor is connected to the first electrode of the fourth transistor.

* * * * *